(12) United States Patent
Ohnishi et al.

(10) Patent No.: US 9,407,166 B2
(45) Date of Patent: Aug. 2, 2016

(54) INVERTER DEVICE

(71) Applicant: Hitachi, Ltd., Chiyoda-ku, Tokyo (JP)

(72) Inventors: Masami Ohnishi, Tokyo (JP); Takeshi Tokuyama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 184 days.

(21) Appl. No.: 14/198,034

(22) Filed: Mar. 5, 2014

(65) Prior Publication Data
US 2014/0286067 A1    Sep. 25, 2014

(30) Foreign Application Priority Data

Mar. 22, 2013   (JP) .................................. 2013-060493

(51) Int. Cl.
| H02M 7/48 | (2007.01) |
| H02M 7/53 | (2006.01) |
| H02M 7/00 | (2006.01) |
| H01L 23/00 | (2006.01) |
| H01L 25/03 | (2006.01) |
| H02M 1/34 | (2007.01) |

(52) U.S. Cl.
CPC ................ H02M 7/53 (2013.01); H01L 24/36 (2013.01); H01L 24/40 (2013.01); H02M 7/003 (2013.01); *H01L 2224/40245* (2013.01); *H01L 2924/12032* (2013.01); *H01L 2924/13055* (2013.01); *H01L 2924/13091* (2013.01); *H02M 1/34* (2013.01)

(58) Field of Classification Search
CPC ....... H02M 7/42; H02M 7/44; H02M 7/5387; H02M 7/003; H02M 7/48; H01L 25/03

USPC .............. 363/95, 97, 98, 131, 132, 144, 147; 361/806
See application file for complete search history.

(56) References Cited

U.S. PATENT DOCUMENTS

| 2004/0188706 A1 | 9/2004 | Chang et al. |
| 2010/0127277 A1 | 5/2010 | Arai et al. |
| 2013/0286617 A1* | 10/2013 | Shibasaki ............. H01L 23/049 361/772 |

FOREIGN PATENT DOCUMENTS

| JP | 5-206449 A | 8/1993 |
| JP | 8-191130 A | 7/1996 |
| JP | 10-93085 A | 4/1998 |
| JP | 2002-368192 A | 12/2002 |
| JP | 2003-309995 A | 10/2003 |
| JP | 2010-129746 A | 6/2010 |

OTHER PUBLICATIONS

Japanese-language Office Action dated Jul. 14, 2015 with English translation (Five (5) pages).

* cited by examiner

*Primary Examiner* — Gary L Laxton
(74) *Attorney, Agent, or Firm* — Crowell & Moring LLP

(57) ABSTRACT

An inverter device includes; a switching element; a plurality of flyback diodes each connected in parallel with the switching element; a first conductor plate connected to anode terminals of the flyback diodes and to one side of the switching element; and a second conductor plate connected to cathode terminals of the flyback diodes and to the other side of the switching element. Each of the flyback diodes is formed in a polygonal shape, and the two flyback diodes in each pair of the flyback diodes that are arranged in mutually adjacent positions are arranged so that a vertex of one opposes a vertex of the other.

8 Claims, 18 Drawing Sheets

REPRESENTATIVE SiC-SBD ELECTRIC CHARACTERISTIC

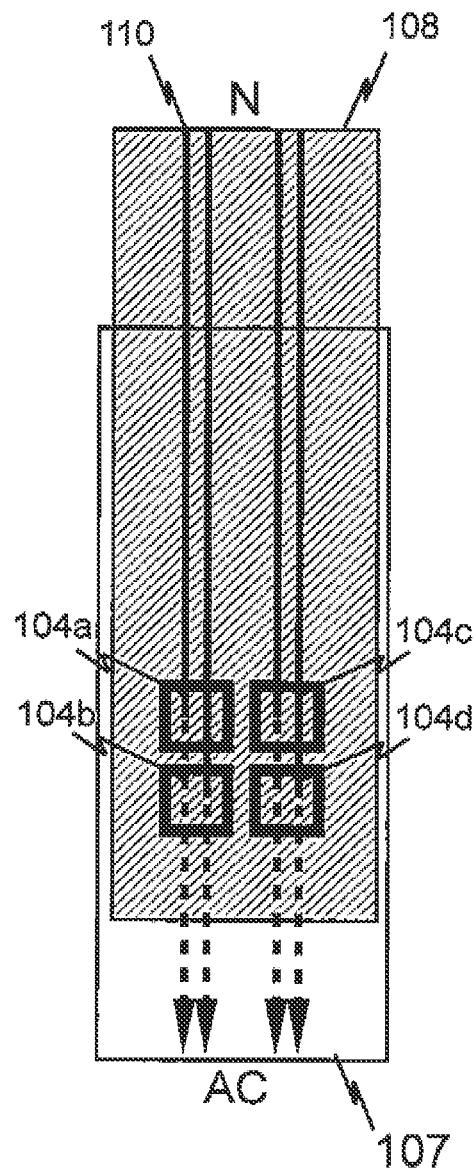

INVERTER DEVICE

INCORPORATION BY REFERENCE

The disclosure of the following priority application is herein incorporated by reference: Japanese Patent Application No. 2013-060493 filed on Mar. 22, 2013.

BACKGROUND OF THE INVENTION

1. Field of the Invention

The present invention relates to an inverter device that converts DC electrical power into AC electrical power.

2. Description of Related Art

Inverter devices that convert DC power into AC power using switching elements such as IGBTs or MOSFETs are widely utilized in the prior art. With an inverter device of this type, flyback diodes are connected in inverse parallel with the switching elements, in order to protect the circuitry from back electromotive forces generated during switching.

In Patent Document #1 (Japanese Laid-Open Patent Publication H10-93085), for an IGBT package in which a plurality of IGBT chips and a plurality of flyback diode chips are connected in parallel, there is disclosed a technique of preventing local concentrations of current or of heat by arranging these chips in a dispersed manner.

However, with a method of arrangement for flyback diodes such as described in the above Patent Document #1, since the gaps between mutually adjacent chips are narrow, accordingly there is a possibility that it is not possible to dissipate heat from the flyback diodes to a sufficient extent.

SUMMARY OF THE INVENTION

An inverter device according to a first aspect of the present invention includes: a switching element; a plurality of flyback diodes each connected in parallel with the switching element; a first conductor plate connected to anode terminals of the flyback diodes and to one side of the switching element; and a second conductor plate connected to cathode terminals of the flyback diodes and to the other side of the switching element.

In this inverter device, it is preferred that: each of the flyback diodes is formed in a polygonal shape; and the two flyback diodes in each pair of the flyback diodes that are arranged in mutually adjacent positions are arranged so that a vertex of one opposes a vertex of the other.

According a second aspect of the present invention, in the inverter device of the first aspect, the flyback diodes may be arranged so that, for each of at least two or more of the flyback diodes, the sum of the length of its current path in the first conductor plate and the length of its current path in the second conductor plate are approximately the same.

According to a third aspect of the present invention, in the inverter device of the second aspect, it is preferred that: the first conductor plate has a first edge portion connected to a load side or to the negative electrode side of a power supply; the second conductor plate has a second edge portion connected to the positive electrode side of the power supply or to the load side; and the flyback diodes are arranged so that, for each of at least two or more of the flyback diodes, the sum of the length upon the first conductor plate from the first edge portion to the anode terminal of the flyback diode and the length upon the second conductor plate from the cathode terminal of the flyback diode to the second edge portion is approximately the same.

According to a fourth aspect of the present invention, in the inverter device of any one of the first through third aspects, the flyback diodes may be arranged so that the total number of pairs of mutually opposing vertices thereof is one less than the total number of the flyback diodes.

According to a fifth aspect of the present invention, in the inverter device of any one of the first through fourth aspects, it is preferred that: a plurality of the switching elements are provided, each having a polygonal shape; and the two switching elements in each pair of the switching elements that are arranged in mutually adjacent positions are arranged so that a vertex of one opposes a vertex of the other.

According to a sixth aspect of the present invention, in the inverter device of the fifth aspect, the switching elements may be arranged so that, for each of at least two or more of the switching elements, the sum of the length of its current path in the first conductor plate and the length of its current path in the second conductor plate are approximately the same.

According to a seventh aspect of the present invention, in the inverter device of the sixth aspect, it is preferred that: the first conductor plate has a first edge portion connected to a load side or to the negative electrode side of a power supply; the second conductor plate has a second edge portion connected to the positive electrode side of the power supply or to the load side; and the switching elements are arranged so that, for each of at least two or more of the switching elements, the sum of the length upon the second conductor plate from the second edge portion to the switching element and the length upon the first conductor plate from the switching element to the first edge portion is approximately the same.

According to an eighth aspect of the present invention, in the inverter device of any one of the fifth through seventh aspects, the switching elements may be arranged so that the total number of pairs of mutually opposing vertices thereof is one less than the total number of the switching elements.

According to the present invention, when a plurality of flyback diodes are connected in parallel, it is possible to dissipate sufficient heat from these flyback diodes.

BRIEF DESCRIPTION OF THE DRAWINGS

FIG. 15 is a figure showing an example of flyback current paths of a lower arm portion in this seventh embodiment of the present invention;

DESCRIPTION OF PREFERRED EMBODIMENTS

Figure 1:
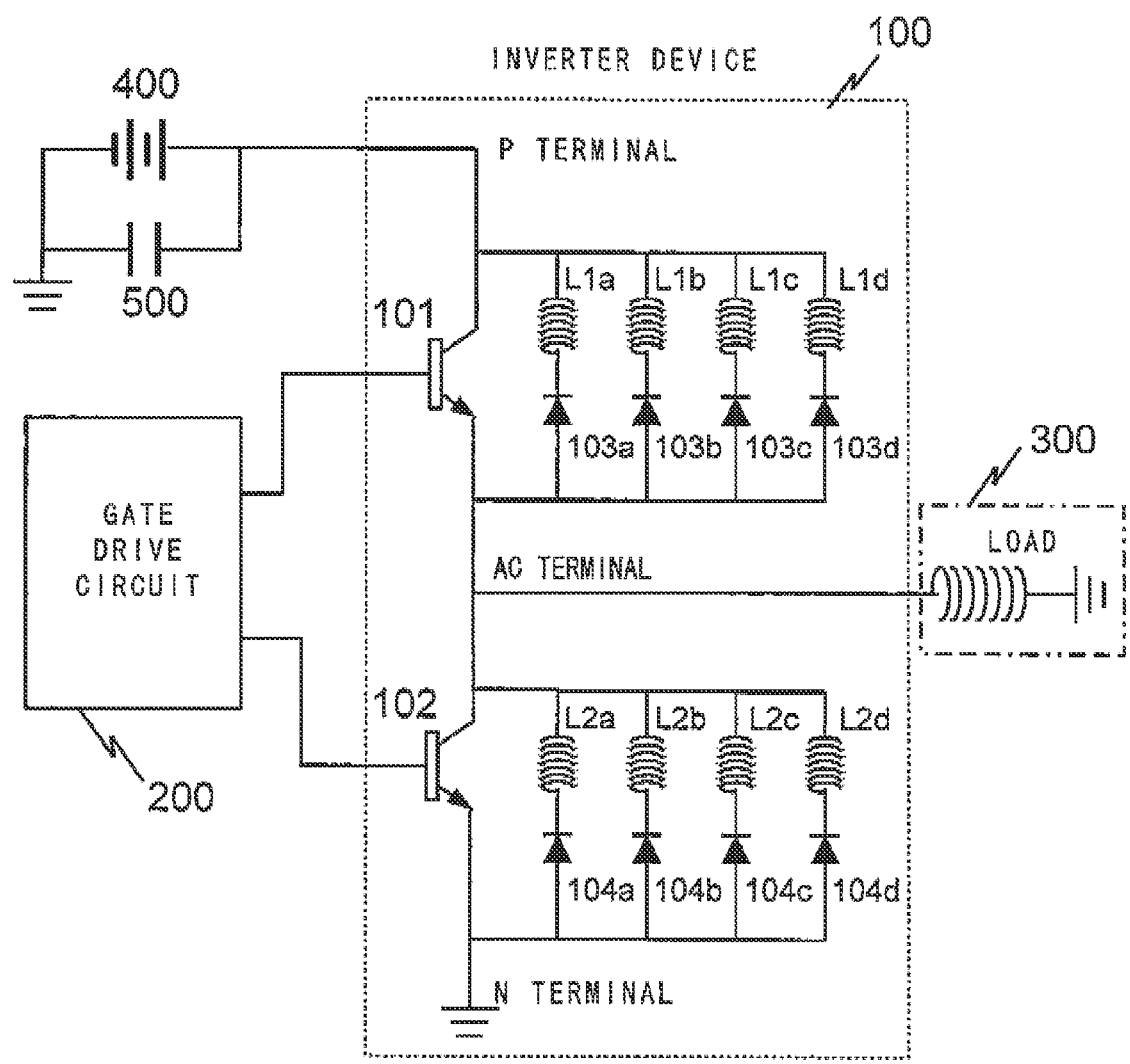
FIG. 1 is a figure showing the circuit structure of an inverter device according to the present invention.

In the following, an inverter device according to the present invention will be explained with reference to the drawings. FIG. 1 is a figure showing the circuit structure of an inverter device 100 according to the present invention. This inverter device 100 is connected to a gate drive circuit 200, a load 300, a DC power supply 400, and a capacitor 500, and comprises an upper arm portion that comprises a switching element 101 and flyback diodes 103a through 103d, and a lower arm portion that comprises a switching clement 102 and flyback diodes 104a through 104d.

The switching elements 101 and 102 are made using IGBTs, that are semiconductor elements. The collector terminal of the switching element 101 is connected to a P terminal that is connected to the DC power supply 400, and the emitter terminal of this switching element 101 is connected to an AC terminal that is connected to the load 300. Moreover, like the emitter terminal of the switching element 101, the collector terminal of the switching element 102 is connected to the AC terminal that is connected to the load 300, while the emitter terminal of this switching element 102 is connected to an N terminal that is connected to ground. Furthermore, the gate terminals of the switching elements 101 and 102 are connected to the gate drive circuit 200.

The switching state of each of the switching elements 101 and 102 is controlled according to a drive signal outputted from the gate drive circuit 200. Thus, in this inverter device 100, the switching elements 101 and 102 are turned on and off at predetermined timings according to the drive signals from the gate drive circuit 200. Due to this, DC power supplied from the DC power supply 400 is converted into AC power that is supplied to the load 300. It should be understood that, instead of IGBTs, elements of some other type could be used for the switching elements 101 and 102, such as for example MOSFETs or the like.

The flyback diodes 103a through 103d are all connected in parallel with the switching element 101, and the flyback diodes 104a through 104d are all connected in parallel with the switching element 102. The anode terminals of the flyback diodes 103a through 103d are connected to the AC terminal, just as is the emitter terminal of the switching element 101; and the cathode terminals of the flyback diodes 103a through 103d are connected to the P terminal, just as is the collector terminal of the switching element 101. Moreover, the anode terminals of the flyback diodes 104a through 104d are connected to the N terminal, just as is the emitter terminal of the switching element 102; and the cathode terminals of the flyback diodes 104a through 104d are connected to the AC terminal, just as is the collector terminal of the switching element 102.

It should be understood that inductance components $L1a$ through $L1d$ are connected in series with the flyback diodes 103a through 103d respectively. In a similar manner, inductance components $L2a$ through $L2d$ are connected in series with the flyback diodes 104a through 104d respectively. The values of these inductance components may vary, according to the mounting arrangement in which the flyback diodes 103a through 103d and 104a through 104d are disposed, and according to the paths of the currents that flow through the flyback diodes 103a through 103d and 104a through 104d. Due to this, during switching, variations are present in the changes of current in the various flyback diodes 103a through 103d and 104a through 104d. As a result differences are engendered in the amounts of heat generated in the various flyback diodes 103a through 103d and 104a through 104d, and this leads to differences in their long term states of health (SOH) and in their electrical characteristics.

Figure 2:
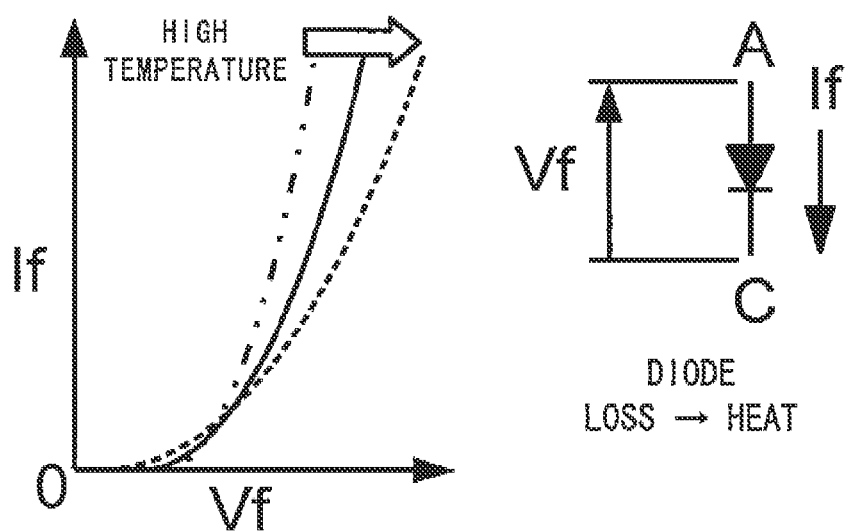
FIG. 2 is a figure for explanation of change of the electrical characteristics of a diode according to temperature.

FIG. 2 is a figure for explanation of change of the electrical characteristics of a diode according to temperature. For example, in the case of a Schottky barrier diode (SiC-SBD) that uses SiC (silicon carbide), if the voltage between the anode and the cathode is termed Vf and the current is termed If, then the relationship of the current If with respect to the voltage Vf changes according to the temperature as shown in FIG. 2. Accordingly it will be understood that, if diodes of this type are used for the flyback diodes 103a through 103d and 104a through 104d of FIG. 1, then differences in the amounts of heat generated will lead to variations of the electrical characteristics, as described above.

Thus with the present invention, in this inverter device 100, it is arranged to make the inductance components $L1a$ through $L1d$ and $L2a$ through $L2d$ more uniform by appropriately designing the arrangement of the semiconductor elements including the flyback diodes 103a through 103d and 104a through 104d, thus reducing the differences between the amounts of heat generated in these components. In the various embodiments of the present invention that will be explained below, examples of diode and/or switching element mounting arrangements of various types for the inverter device 100 will be explained.

Embodiment #1

Figure 3:
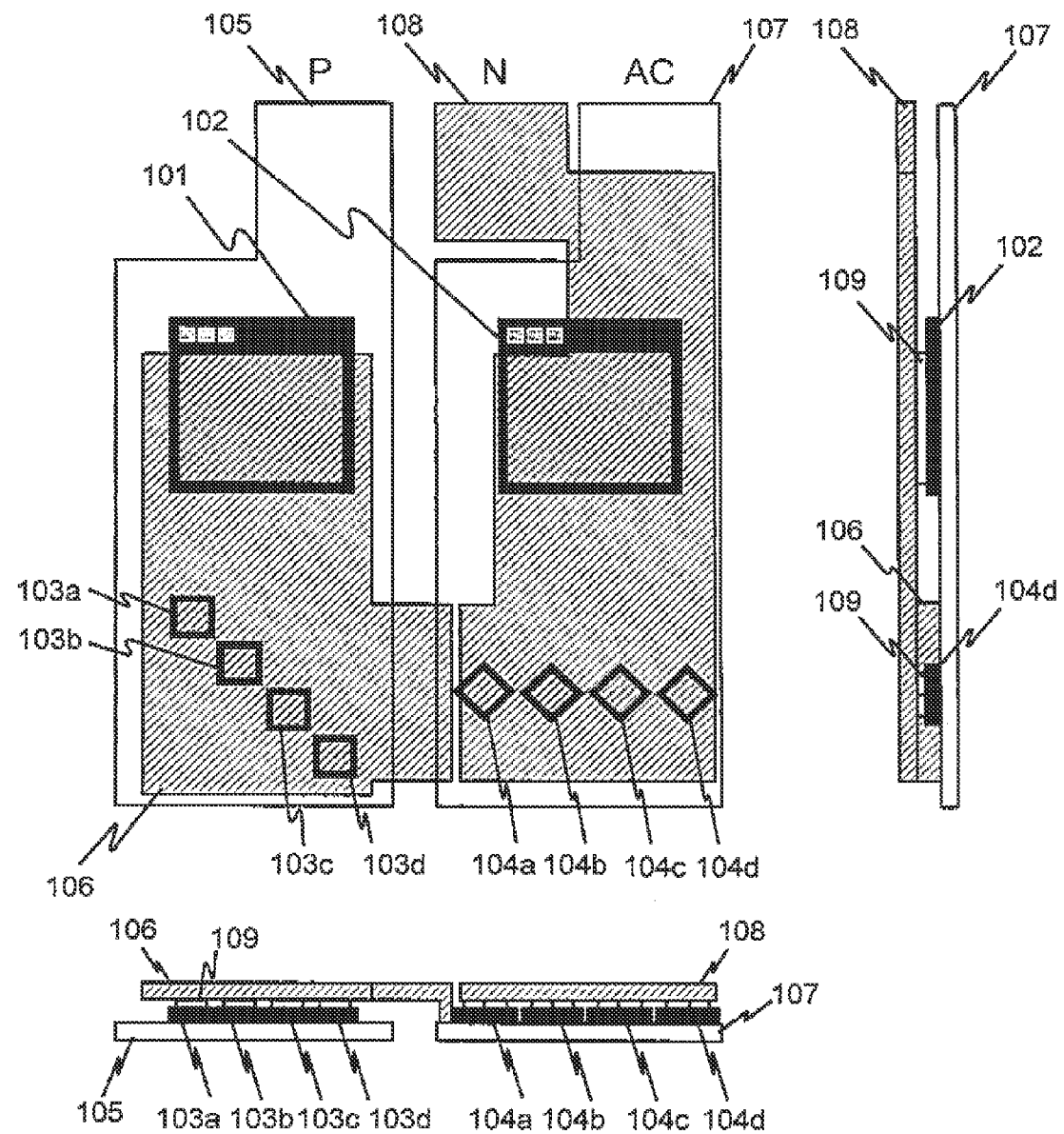
FIG. 3 is a three-view drawing showing a mounting arrangement in an inverter device according to a first embodiment of the present invention.

FIG. 3 is a three-view drawing showing a mounting arrangement in the inverter device 100 according to a first embodiment of the present invention. As shown in FIG. 3, in this embodiment, a switching element 101 and flyback diodes 103a through 103d of an upper arm portion are disposed as being sandwiched between a high voltage side lead frame 105 and a connecting lead frame 106. Moreover, a switching element 102 and flyback diodes 104a through 104d of a lower arm portion are disposed as being sandwiched between a low voltage side lead frame 108 and an AC lead frame 107. Each of the switching elements 101 and 102 is provided with an emitter terminal on its front surface side and with a collector terminal on its rear surface side, and each of the flyback diodes 103a through 103d and 104a through 104d is provided with an anode terminal on its front surface side and with a cathode terminal on its rear surface side.

In the upper arm portion, the collector terminal of the switching element 101 and the cathode terminals of the flyback diodes 103a through 103d are connected to the high voltage side lead frame 105. And the previously described P terminal is formed at the upper edge portion of the high voltage side lead frame 105. In other words, the collector terminal of the switching element 101 and the cathode terminals of the flyback diodes 103a through 103d are connected to the DC power supply 400 of FIG. 1 via the high voltage side lead frame 105.

Moreover, the emitter terminal of the switching element 101 and the anode terminals of the flyback diodes 103a through 103d are connected to the connecting lead frame 106 via metallic spacers 109. The lower right edge portion in FIG. 3 of the connecting lead frame 106 is joined to the AC lead frame 107, and the previously described AC terminal is formed upon the upper edge portion of the AC lead frame 107. In other words, the emitter terminal of the switching element 101 and the anode terminals of the flyback diodes 103a through 103d are connected to the load 300 of FIG. 1 via the connecting lead frame 106 and the AC lead frame 107.

On the other hand, in the lower arm portion, the collector terminal of the switching element 102 and the cathode terminals of the flyback diodes 104a through 104d are connected to the AC lead frame 107. And, as previously described, the AC terminal is formed at the upper edge portion of the AC lead frame 107. In other words, the collector terminal of the switching element 102 and the cathode terminals of the flyback diodes 104a through 104d are connected to the load 300 of FIG. 1 via the AC lead frame 107.

Moreover, the emitter terminal of the switching element 102 and the anode terminals of the flyback diodes 104a through 104d are connected to the low voltage side lead frame 108 via metallic spacers 109. The previously described N terminal is formed upon the upper edge portion of the low voltage side lead frame 108. In other words, the emitter terminal of the switching element 102 and the anode terminals of the flyback diodes 1.04a through 1.04d are connected to ground as shown in the circuit diagram of FIG. 1 via the low voltage side lead frame 108.

Each of the flyback diodes 103a through 103d and 104a through 104d has a square shape. The flyback diodes 103a through 103d of the upper arm portion are mounted and arranged along a straight line that extends slantingly and that is angled in a direction of 45° with respect to their sides. On the other hand, the flyback diodes 104a through 104d of the lower arm portion are mounted and arranged along a straight line that is horizontal in the figure and are each oriented so that the directions of its straight sides are angled slantingly at 45° with respect to the horizontal direction in the figure. According to this type of configuration, in both the case of the flyback diodes 103a through 103d and the case of the flyback diodes 104a through 104d, mutually adjacent pairs thereof confront one another via mutually opposing vertices, and not via mutually opposing sides. In other words, among the flyback diodes 103a through 103d and the flyback diodes 104a through 104d, the two diodes of each pair that are disposed in mutually adjacent positions are arranged so that a vertex of each of them confronts a vertex of the other.

By providing an arrangement such as described above, it is possible to alleviate mutual thermal interference between the various flyback diodes 103a through 103d and between the various flyback diodes 104a through 104d. Due to this, it is possible to perform sufficient heat dissipation from the flyback diodes 103a through 103d and from the flyback diodes 104a through 104d.

It should be understood that, among the flyback diodes 103a through 103d, the flyback diode 103a and the flyback diode 103b are mutually adjacent, as are the flyback diode 103b and the flyback diode 103c, and the flyback diode 103c and the flyback diode 103d. In other words, in the case of the four flyback diodes 103a through 103d, the total number of pairs of mutually opposing vertices is three. In a similar manner, in the case of the four flyback diodes 104a through 104d, the total number of pairs of mutually opposing vertices is three. In this way, the set of flyback diodes 103a through 103d and the set of flyback diodes 104a through 104d are both arranged so that the total number of pairs of mutually opposing vertices in the set becomes one less than the total number of flyback diodes in the set. By providing this sort of arrangement, it is possible to reduce the mutual thermal interference between the flyback diodes, and thus to enhance their heat dissipation performance, as compared to a case in which the flyback diodes are arranged in an annular configuration.

Figure 4:
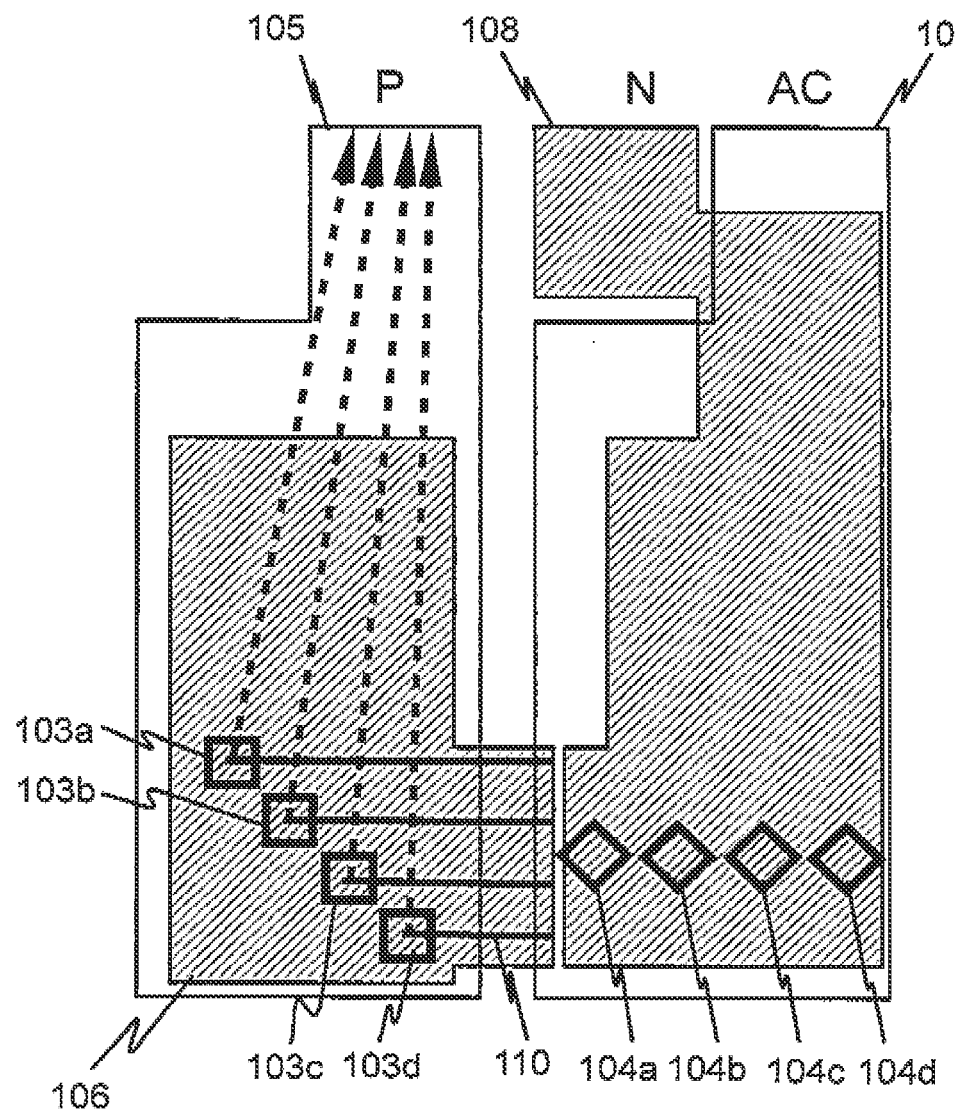
FIG. 4 is a figure showing an example of flyback current paths in an upper arm portion of this first embodiment of the present invention.

FIG. 4 is a figure showing an example of the flyback current paths of the upper arm portion in this first embodiment of the present invention. It should be understood that the switching elements 101 and 102 are omitted from FIG. 4, in order to show the flyback current paths in an easily understood manner.

In this embodiment, the flyback currents that flow via the flyback diodes 103a through 103d of the upper arm portion follow current paths 110 through the connecting lead frame 106 and the high voltage side lead frame 105, as shown in FIG. 4. In concrete terms, the flyback currents that are inputted from the AC terminal reach the connecting lead frame 106 after initially passing through the AC lead frame 107. And, in the connecting lead frame 106, the flyback currents flow via the current paths 110 shown by the solid lines, from the junction portion with the AC lead frame 107 up to the anode terminals of the flyback diodes 103a through 103d. And, after passing through the flyback diodes 103a through 103d, the flyback currents then flow from the cathode terminals of the flyback diodes 103a through 103d to the P terminal via the current paths 110 in the high voltage side lead frame 105 as shown by the broken lines.

Here, the lengths of the current paths 110 in the connecting lead frame 106 shown by the solid lines are approximately equal to the lengths upon the connecting lead frame 106 from the lower right edge portion that is connected to the load side 300 via the AC lead frame 107 to the anode terminals of the flyback diodes 103a through 103d respectively. Moreover, the lengths of the current paths 110 in the high voltage side lead frame 105 shown by the broken lines are approximately equal to the lengths upon the high voltage side lead frame 105 from the cathode terminals of the flyback diodes 103a through 103d to the P terminal that is connected to the positive electrode side of the DC power supply 400, in other words to its upper edge portion, respectively. The sum of these two lengths is approximately of the same order for all of the flyback diodes 103a through 103d. In this manner, in this embodiment, the flyback diodes 103a through 103d are arranged so that the sum of the length of the current path 110 in the connecting lead frame 106 and the length of the current path 110 in the high voltage side lead frame 105 are approximately equal for all of the flyback diodes 103a through 103d. Due to this, it is possible to make the inductance components L1a through L1d shown in FIG. 1 all uniform. Accordingly, it is possible to reduce the differences in the amounts of heat generated in the flyback diodes 103a through 103d, so that it is possible to make their electrical characteristics more uniform.

It should be understood that, while an example of the flyback current paths for the upper arm portion was shown in FIG. 4, the same holds for the flyback current paths in the lower arm portion. In other words, the flyback diodes 104a through 104d are arranged so that the sum of the length of the current path in the low voltage side lead frame 108 and the length of the current path in the AC lead frame 107 is approximately the same for all of the flyback diodes 104a through 104d. Due to this, it is possible to make the inductance components L2a through L2d shown in FIG. 1 all uniform. Accordingly, it is possible to reduce the differences in the amounts of heat generated in the flyback diodes 104a through 104d, and thus it is possible to keep their electrical characteristics more uniform.

According to the first embodiment of the present invention as explained above, the following beneficial operational effects are obtained.

(1) In this inverter device 100, the switching element 101 and the flyback diodes 103a through 103d that have square shapes are connected in parallel, and the switching element 102 and the flyback diodes 104a through 104d that also have square shapes are likewise connected in parallel. The two of the flyback diodes 103a through 103d in each pair thereof that are arranged in mutually adjacent positions are disposed so that a vertex on each of them confronts a vertex on the other, and the same condition holds for the flyback diodes 104a through 104d. Since this arrangement is employed, accordingly it is possible to perform sufficient heat dissipation when the flyback diodes 103a through 103d are connected in parallel and the flyback diodes 104a through 104d are connected in parallel.

(2) In the upper arm portion, the connecting lead frame 106 is connected to the anode terminals of the flyback diodes 103a through 103d and to one side of the switching element 101 (its emitter terminal side), and the high voltage side lead frame 105 is connected to the cathode terminals of the flyback diodes 103a through 103d and to the other side of the switching element 101 (its collector terminal side). The flyback diodes 103a through 103d are arranged so that the sum of the length of the current path 110 in the connecting lead frame 106 and the length of the current path 110 in the high voltage side lead frame 105 is approximately the same for all of the flyback diodes 103a through 103d. In concrete terms, the flyback diodes 103a through 103d are arranged so that the sum of the length upon the connecting lead frame 106 from the lower right edge portion of the connecting lead frame 106 that is connected to the load 300 via the AC lead frame 107 to the anode terminal of each one of the flyback diodes 103a through 103d, and the length upon the high voltage side lead frame 105 from the cathode terminal of that one of the flyback diodes 103a through 103d to the upper edge portion of the high voltage side lead frame 105 that is connected to the positive electrode side of the DC power supply 400, is approximately the same for all of the flyback diodes 103a through 103d. Since this arrangement is employed, accordingly it is possible to make the inductance components L1a through L1d more uniform, and thus it is possible to keep the electrical characteristics of the flyback diodes 103a through 103d closer together.

(3) Moreover, in the lower arm portion, the low voltage side lead frame 108 is connected to the anode terminals of the flyback diodes 104a through 104d and to one side of the switching element 102 (its emitter terminal side), and the AC lead frame 107 is connected to the cathode terminals of the flyback diodes 104a through 104d and to the other side of the switching element 102 (its collector terminal side). The flyback diodes 104a through 104d are arranged so that the sum of the length of the current path 110 in the low voltage side lead frame 108 and the length of the current path 110 in the AC lead frame 107 is approximately the same for all of the flyback diodes 104a through 104d. In concrete terms, the flyback diodes 104a through 104d are arranged so that the sum of the length upon the low voltage side lead frame 108 from the upper edge portion of the low voltage side lead frame 108 that is connected to the negative electrode side of the DC power supply 400 to the anode terminal of each one of the flyback diodes 104a through 104d, and the length upon the AC lead frame 107 from the cathode terminal of that one of the flyback diodes 104a through 104d to the upper edge portion of the AC lead frame 107 that is connected to the load 300, is approximately the same for all of the flyback diodes 104a through 104d. Since this arrangement is employed, accordingly it is possible to make the inductance components L2a through L2d more uniform, and thus it is possible to keep the electrical characteristics of the flyback diodes 104a through 104d closer together.

(4) Both the set of flyback diodes 103a through 103d and the set of flyback diodes 104a through 104d are arranged so that the total number of pairs of mutually opposing vertices in the set becomes one less than the total number of flyback diodes in the set. Since this arrangement is provided, accordingly it is possible to enhance the heat dissipation performance.

Embodiment #2

Figure 5:
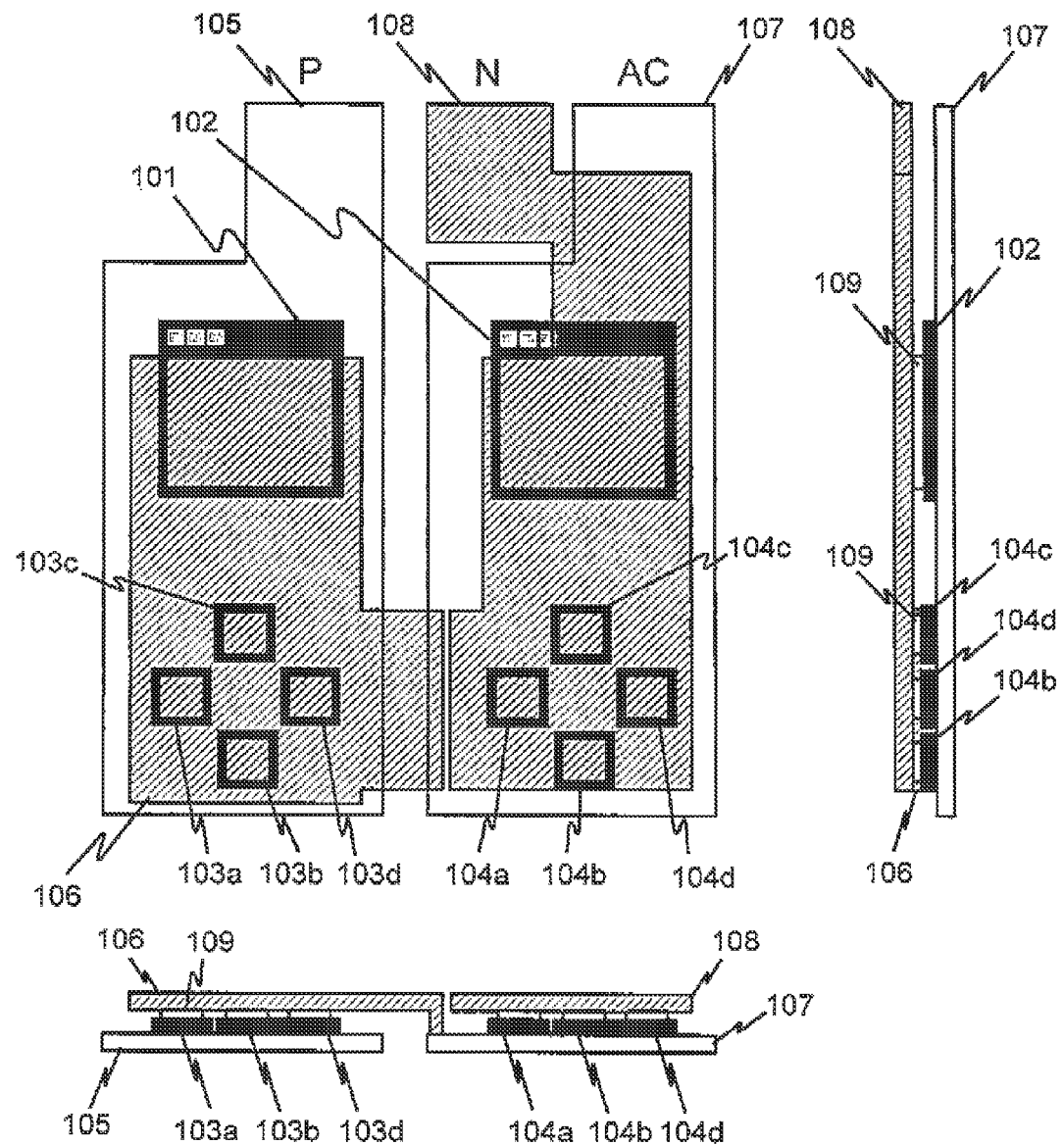
FIG. 5 is a three-view drawing showing a mounting arrangement in an inverter device according to a second embodiment of the present invention.

FIG. 5 is a three-view drawing showing a mounting arrangement in the inverter device 100 according to a second embodiment of the present invention. In this embodiment, the flyback diodes 103a through 103d of the upper arm portion and the flyback diodes 104a through 104d of the lower arm portion are, in both cases, arranged in the positional relationships shown in FIG. 5. With this arrangement, in a similar manner to the first embodiment described above, among the flyback diodes 103a through 103d and the flyback diodes 104a through 104d, the two in each pair thereof that are arranged in mutually adjacent positions are disposed so that a vertex on each of them confronts a vertex on the other. Due to this, it is possible to alleviate mutual thermal interference between the flyback diodes 103a through 103d and the flyback diodes 104a through 104d, and it is possible to perform sufficient heat dissipation from the flyback diodes.

Figure 6:
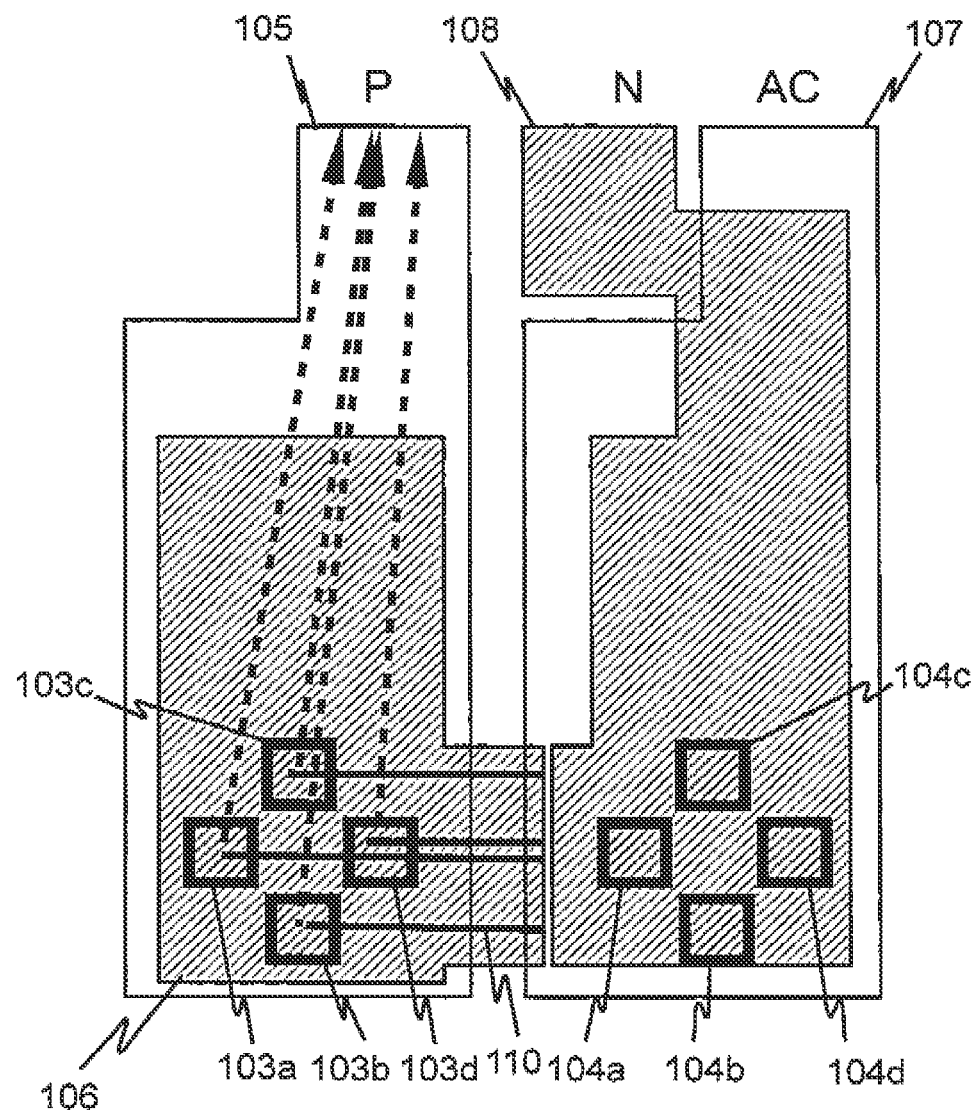
FIG. 6 is a figure showing an example of flyback current paths in an upper arm portion of this second embodiment of the present invention.

FIG. 6 is a figure showing an example of flyback current paths in the upper arm portion of this second embodiment of the present invention. It should be understood that the switching elements 101 and 102 are omitted from FIG. 6, in order to show the flyback current paths in an easily understood manner.

In this embodiment, for each of the flyback diodes 103a and 103b, the sum of the length of its current path 110 in the connecting lead frame 106 and the length of its current path 110 in the high voltage side lead frame 105 is approximately the same. Moreover, apart from the above, for each of the other two remaining ones of the flyback diodes 103c and 103d as well, the sum of the length of its current path 110 in the connecting lead frame 106 and the length of its current path 110 in the high voltage side lead frame 105 is approximately the same. Accordingly, along with it being possible to make the inductance components L1a and L1b mutually uniform, also it is possible to make the inductance components L1c and L1d mutually uniform. Thus, both for the combination of the flyback diode 103a and the flyback diode 103b, and also for the combination of the flyback diode 103c and the flyback diode 103d, it is possible to reduce the difference between the amounts of heat generated, and thereby it is possible to keep their electrical characteristics more uniform.

It should be understood that while, in FIG. 6, an example of the flyback current paths in the upper arm portion was shown by way of example, the lengths of the flyback current paths in the lower arm portion are also the same for the combinations of the flyback diodes 104a and 104d. However, apart from the above stipulation, the lengths of the flyback current paths for the flyback diodes 104b and 104c are not necessarily the same.

According to the second embodiment of the present invention as explained above, while the beneficial effect is slightly inferior to that provided by the first embodiment, when the flyback diodes 103a through 103d are connected in parallel and also the flyback diodes 104a through 104d are connected in parallel, it is possible to perform heat dissipation from them to a sufficient extent. Moreover, it is possible to make the inductance components L1a through L1d uniform and also to make the inductance components L2a through L2d uniform, so that it is possible to make the electrical characteristics of the flyback diodes 103a through 103d more uniform, and to make the electrical characteristics of the flyback diodes 104a through 104d more uniform.

Embodiment #3

Figure 7:
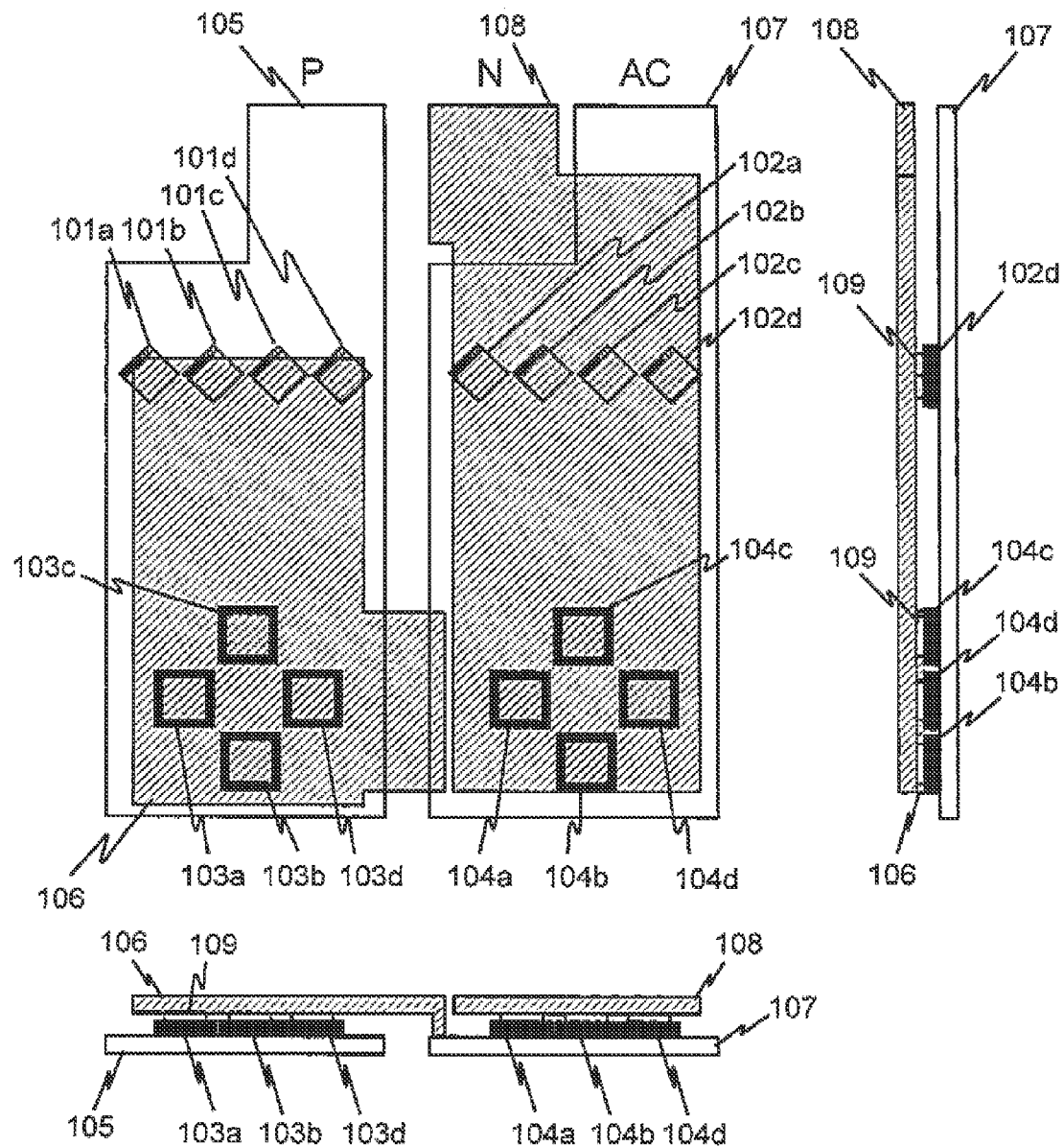
FIG. 7 is a three-view drawing showing a mounting arrangement in an inverter device according to a third embodiment of the present invention.

FIG. 7 is a three-view drawing showing a mounting arrangement in the inverter device 100 according to a third embodiment of the present invention. In this embodiment, switching elements 101a through 101d of the upper arm portion and switching elements 102a through 102d of the lower arm portion are all arranged in the positional relationships shown in FIG. 7. According to this type of configuration, in both the case of the switching elements 101a through 101d and the case of the switching elements 102a through 102d, they confront one another via mutually opposing vertices, and not via mutually opposing sides. In other words, among the switching elements 101a through 101d and the switching elements 102a through 102d, the two switching elements of each pair that are disposed in mutually adjacent positions are arranged so that a vertex of each of them confronts a vertex of the other. Due to this, it is possible to alleviate mutual thermal interference between the switching elements 101a through 101d and the switching elements 102a through 102d. And, due to this, it is possible to perform sufficient heat dissipation from the switching elements 101a through 101d and the switching elements 102a through 102d. It should be understood that the switching elements 101a through 101d are electrically connected in parallel, and similarly the switching elements 102a through 102d are electrically connected in parallel.

Moreover, in the set of switching elements 101a through 101d, the pair of switching elements 101a and 101b are mutually adjacent, as are the pair of switching elements 101b and 101c, and the pair of switching elements 101c and 101d, In other words, among the four switching elements 101a through 101d, the total number of pairs of mutually opposing vertices is three. In a similar manner, among the four switching elements 102a through 102d, the total number of pairs of mutually opposing vertices is also three. In this manner, the set of switching elements 101a through 101d and the set of switching elements 102a through 102d are both arranged so that the total number of pairs of mutually opposing vertices in them is one less than the total number of switching elements 101a through 101d or 102a through 102d. By providing this type of arrangement, it is possible further to reduce the mutual thermal interference and it is possible further to enhance the heat dissipation performance, as compared to a case in which the switching elements are arranged in an annular configuration.

Figure 8:
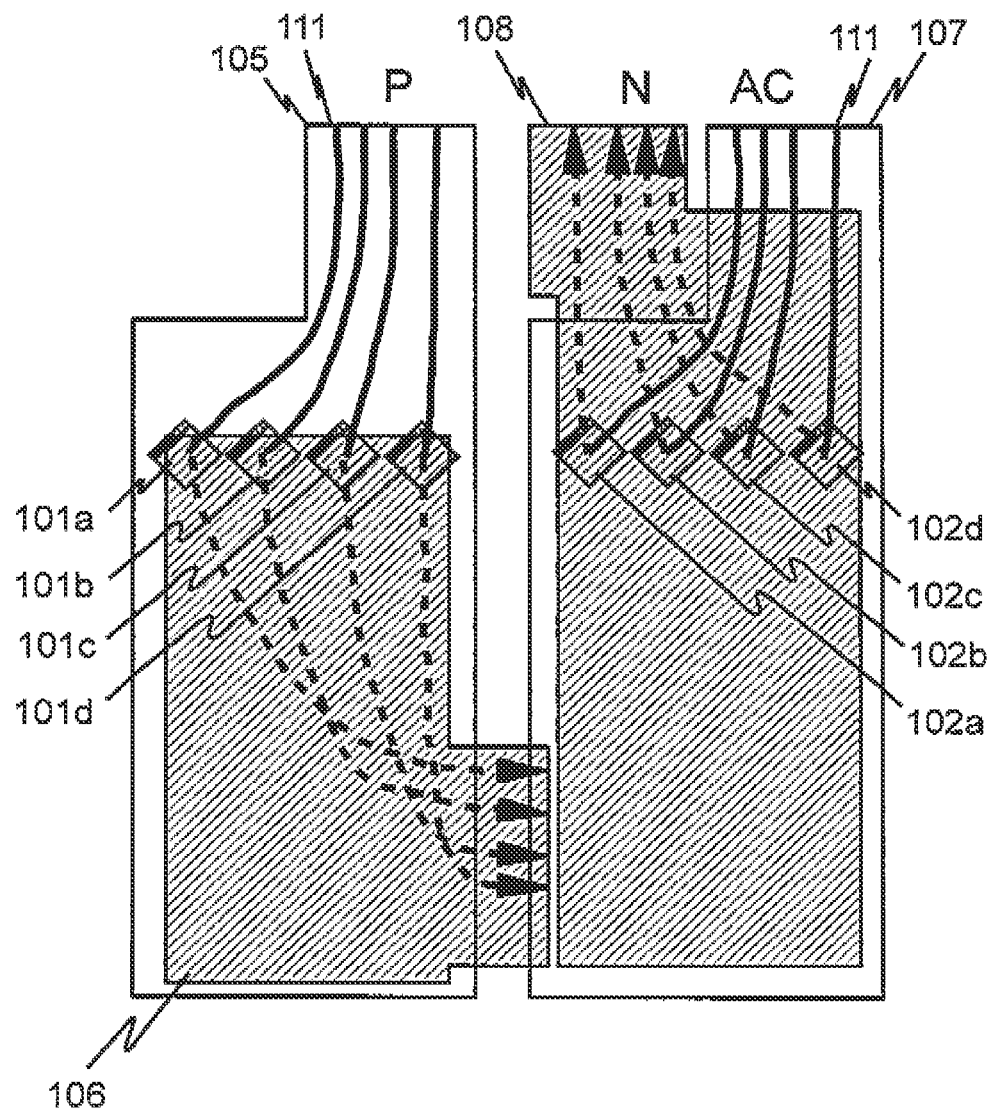
FIG. 8 is a figure showing an example of drive current paths in an upper arm portion and in a lower arm portion of this third embodiment of the present invention.

FIG. 8 is a figure showing an example of the drive current paths in the upper arm portion and the lower arm portion of this third embodiment of the present invention. It should be understood that, in FIG. 8, in order to show the drive current paths in an easily understood manner, the flyback diodes 103a through 103d and 104a through 104d are omitted from the figure.

In the high voltage side lead frame 105 and the connecting lead frame 106, the drive currents that flow through the switching elements 101a through 101d of the upper arm portion follow respective current paths 111 as shown in FIG. 8. In concrete terms, the drive currents flow from the P terminal along the current paths 111 in the high voltage side lead frame 105 shown by the solid lines to the collector terminals of the switching elements 101a through 101d. And, after having passed through the switching elements 101a through 101d, the drive currents flow from the emitter terminals of the switching elements 101a through 101d along the current paths 111 in the connecting lead frame 106 shown by the broken lines to the junction portion with the AC lead frame 107.

Here, the lengths of the current paths 111 in the high voltage side lead frame 105 shown by the solid lines are approximately equal to the lengths upon the high voltage side lead frame 105 from the P terminal that is connected to the positive electrode side of the DC power supply 400, in other words from its upper edge portion, to the collector terminals of the switching elements 101a through 101d respectively. Moreover, the lengths of the current paths 111 in the connecting lead frame 106 shown by the broken lines are approximately equal to the lengths upon the connecting lead frame 106 from the emitter terminals of the switching elements 101a through 101d to its lower right edge portion that is connected to the load 300 side via the AC lead frame 107 respectively. The sums of these two lengths are of approximately the same order for all of the switching elements 101a through 101d. In this manner, in this embodiment, the switching elements 101a through 101d are arranged so that the sum of the length of the current path 111 in the connecting lead frame 106 and the length of the current path 111 in the high voltage side lead frame 105 is approximately the same for each of the switching elements 101a through 101d. Due to this, it is possible to make inductance components that are provided in series with each of the switching elements 101a through 101d uniform, in a similar manner to what was done in the case of the inductance components L1a through L1d described above. Accordingly it is possible to reduce differences in the amounts of heat generated in the switching elements 101a through 101d, and this to keep their electrical characteristics more uniform.

On the other hand, in the AC lead frame 107 and the low voltage side lead frame 108, the drive currents that flow through the switching elements 102a through 102d of the lower arm portion follow respective current paths 111 as shown in FIG. 8. In concrete terms, the drive currents flow from the AC terminal along the current paths 111 shown by the solid lines in the AC lead frame 107 to the collector terminals of the switching elements 102a through 102d. And, after having passed through the switching elements 102a through 102d, the drive currents flow from the emitter terminals of the switching elements 102a through 102d along the current paths 111 in the low voltage side lead frame 108 shown by the broken lines to the N terminal.

Here, the lengths of the current paths 111 in the AC lead frame 107 shown by the solid lines are approximately equal to the lengths upon the AC lead frame 107 from the AC terminal that is connected to the load 300 side, in other words from its upper edge portion, to the collector terminals of the switching elements 102a through 102d respectively. Moreover, the lengths of the current paths 111 in the low voltage side lead frame 108 shown by the broken lines are approximately equal to the lengths upon the low voltage side lead frame 108 from the emitter terminals of the switching elements 102a through 102d to the N terminal that is connected to the negative electrode side of the DC power supply 400, in other words to its upper edge portion, respectively. The sums of these two lengths are of approximately the same order for all of the switching elements 102a through 102d. In this manner, in this embodiment, the switching elements 102a through 102d are arranged so that the sum of the length of the current path 111 in the AC lead frame 107 and the length of the current path 111 in the low voltage side lead frame 108 is approximately the same for each of the switching elements 102a through 102d. Due to this, it is possible to make inductance components that are provided in series with each of the switching elements 102a through 102d uniform, in a similar manner to What was done in the case of the inductance components L2a through L2d described above. Accordingly it is possible to reduce differences in the amounts of heat generated in the switching elements 102a through 102d, and thus it is possible to keep their electrical characteristics more uniform.

According to the third embodiment of the present invention as explained above, the following beneficial operational effects are obtained.

(5) In this inverter device 100, the switching elements 101a through 101d that have square shapes are all connected in parallel, and similarly the switching elements 102a through 102d that also have square shapes are all connected in parallel. And the two among the switching elements 101a through 101d in each pair thereof that are arranged in mutually adjacent positions are disposed so that a vertex on each of them confronts a vertex on the other, and the same condition holds for the switching elements 102a through 102d. Since this arrangement is employed, accordingly it is possible to perform sufficient heat dissipation when the switching elements 101a through 101d are connected in parallel and the switching elements 102a through 102d are connected in parallel.

(6) In the upper arm portion, the switching elements 101a through 101d are arranged so that the sum of the length of the current path 111 in the connecting lead frame 106 and the length of the current path 111 in the high voltage side lead frame 105 is approximately the same for all of the switching elements 101a through 101d. Moreover, in the lower arm portion, the switching elements 102a through 102d are arranged so that the sum of the length of the current path 111 in the low voltage side lead frame 108 and the length of the current path 111 in the AC lead frame 107 is approximately the same for all of the switching elements 102a through 102d. Since this arrangement is employed, accordingly it is possible to make inductance components that are provided in series with the switching elements 101a through 101d and the switching elements 102a through 102d more uniform, and thus it is possible to keep the electrical characteristics of the switching elements 101a through 101d and the electrical characteristics of the switching elements 102a through 102d more uniform.

(7) Each of the set of switching elements 101a through 101d and the set of switching elements 102a through 102d is arranged so that the total number of pairs of mutually opposing vertices in the set becomes one less than the total number of flyback diodes in the set. Since this configuration is provided, accordingly it is possible to enhance the heat dissipation performance.

Embodiment #4

Figure 9:
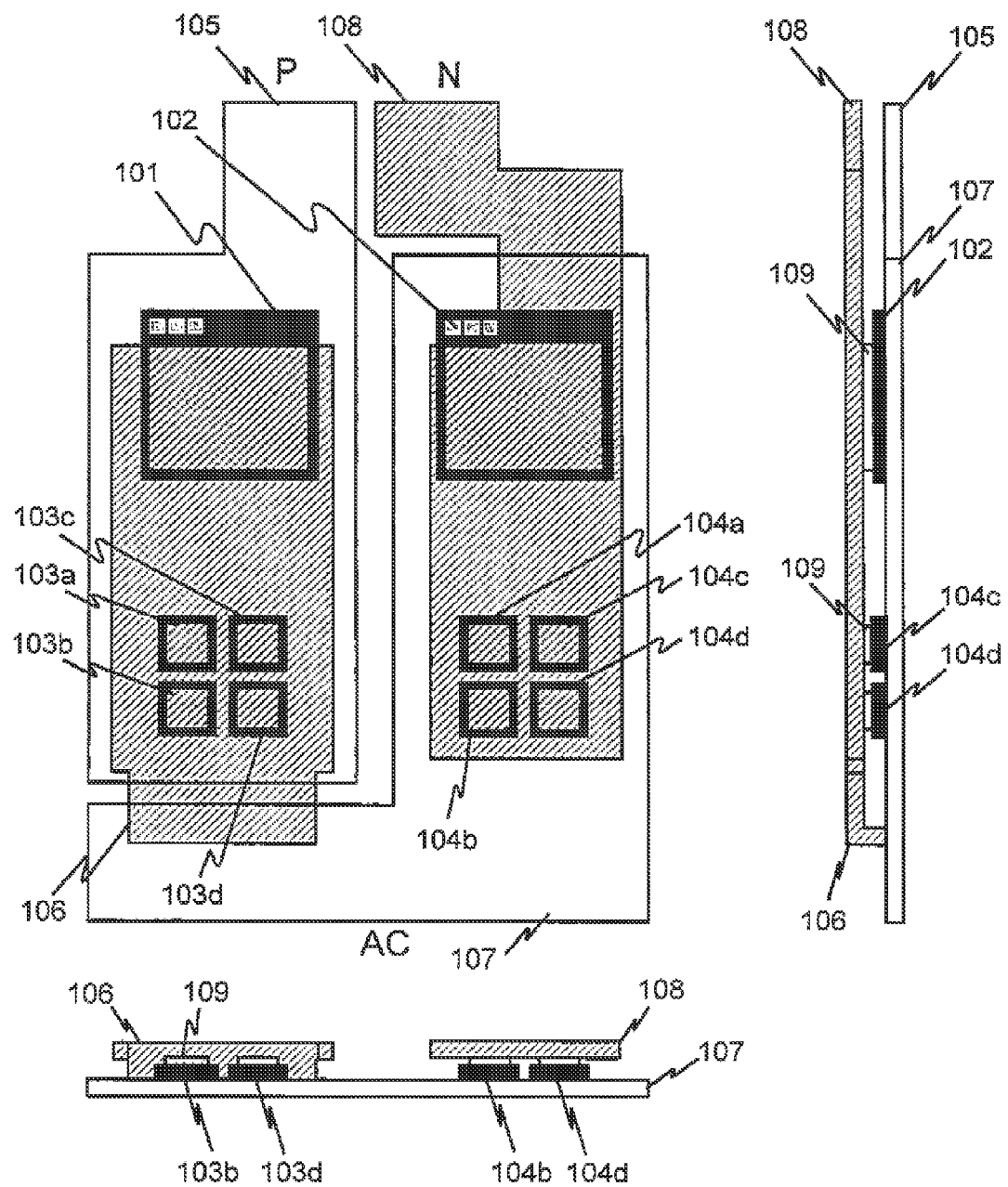
FIG. 9 is a three-view drawing showing a mounting arrangement in an inverter device according to a fourth embodiment of the present invention.

FIG. 9 is a three-view drawing showing a mounting arrangement of the inverter device 100 according to a fourth embodiment of the present invention. In this embodiment, the flyback diodes 103a through 103d of the upper arm portion and the flyback diodes 104a through 104d of the lower arm portion are all arranged in the positional relationships shown in FIG. 9. Moreover, the AC lead frame 107 has a shape as shown in FIG. 9, and the AC terminal is formed upon its tower edge portion. The connecting lead frame 106 is joined at its lower edge portion to the AC lead frame 107.

Figure 10:
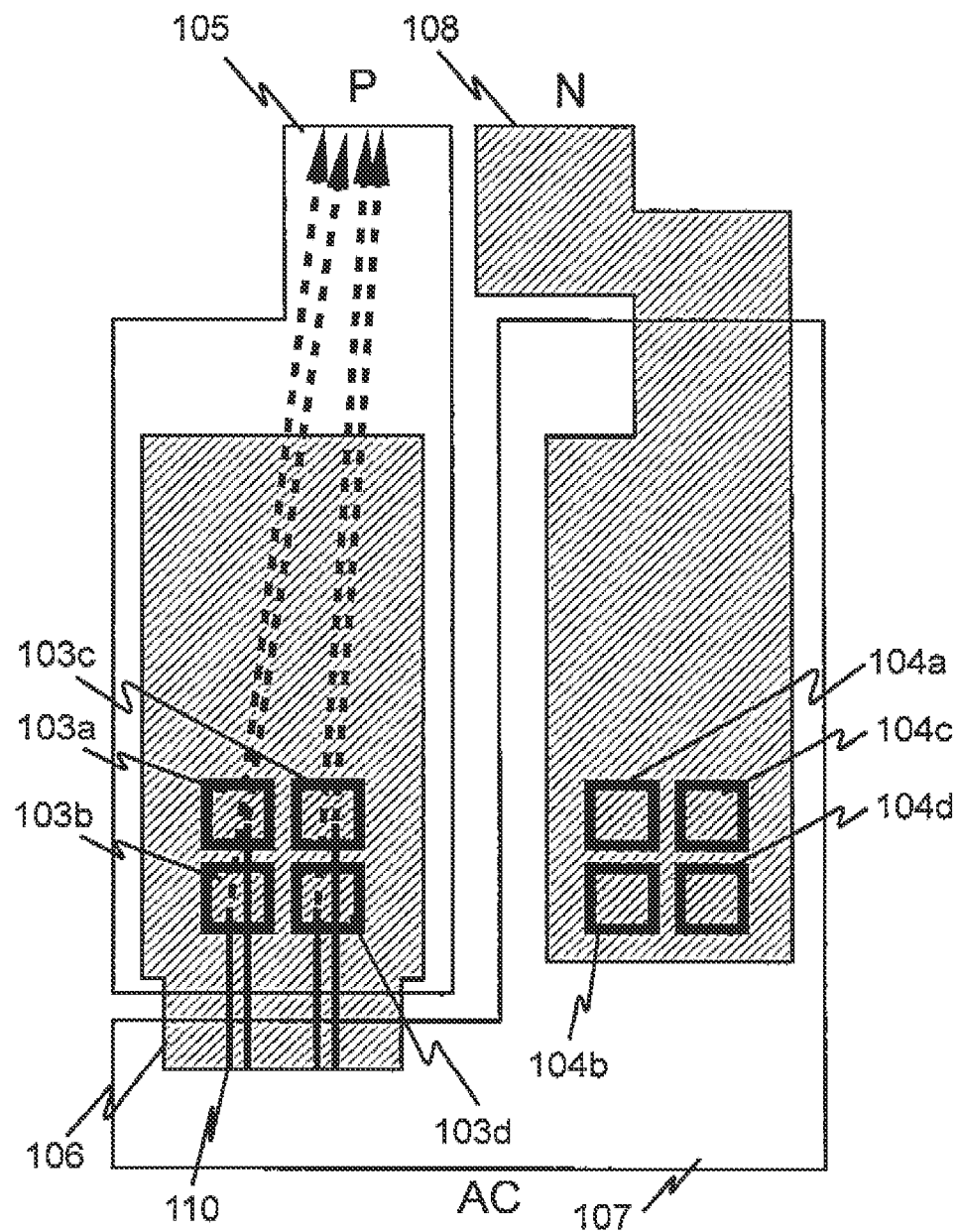
FIG. 10 is a figure showing an example of flyback current paths of an upper arm portion in this fourth embodiment of the present invention.

FIG. 10 is a figure showing an example of flyback current paths in the upper arm portion in this fourth embodiment of the present invention. It should he understood that in FIG. 10, in order to show the flyback current paths in an easily understood manner, the switching elements 101 and 102 are omitted from the figure.

In this embodiment, the flyback currents that flow through the flyback diodes 103a through 103d of the upper arm portion pursue current paths 110 as shown in FIG. 10 in the connecting lead frame 106 and in the high voltage side lead frame 105. The lengths of the current paths 110 in the connecting lead frame 106 shown by the solid lines are approximately equal to the lengths upon the connecting lead frame 106 from its lower edge portion that is connected via the AC lead frame 107 to the load 300 side, to the anode terminals of the flyback diodes 103a through 103d respectively. Furthermore, the lengths of the current paths 110 in the high voltage side lead frame 105 shown by the broken lines are approximately equal to the lengths upon the high voltage side lead frame 105 from the cathode terminals of the flyback diodes 103a through 103d to the P terminal that is connected to the positive electrode side of the DC power supply 400, in other words to its upper edge portion, respectively. The sum of these two lengths is of approximately the same order for all of the flyback diodes 103a through 103d. In this manner, in this embodiment as well, the flyback diodes 103a through 103d are arranged so that the sum of the length of the current path 110 in the connecting lead frame 106 and the length of the current path 110 in the high voltage side lead frame 105 is approximately the same for all of the flyback diodes 103a through 103d. Due to this configuration, it is possible to make the inductance components L1a through L1d shown in FIG. 1 more uniform. Accordingly, it is possible to reduce the differences in the amounts of heat generated in the flyback diodes 103a through 103d, and thus it is possible to make their electrical characteristics more uniform.

It should be understood that, while in FIG. 10 the example of the flyback current paths in the upper arm portion was shown, a similar relationship to the one described above also holds for the flyback current paths in the lower arm portion. In other words, the lengths of the current paths in the low voltage side lead frame 108 are approximately equal to the lengths upon the low voltage side lead frame 108 from the N terminal that is connected to the negative electrode side of the DC power supply 400, in other words from its upper edge portion, to the anode terminals of the flyback diodes 104a through 104d respectively. Furthermore, the lengths of the current paths in the AC lead frame 107 are almost equal to the lengths upon the AC lead frame 107 from the cathode terminals of the flyback diodes 104a through 104d to the AC terminal that is connected to the load 300 side, in other words to its lower edge portion, respectively. The sum of these two lengths is approximately of the same order for all of die flyback diodes 104a through 104d. In this manner, in this embodiment as well, the flyback diodes 104a through 104d are arranged so that the sum of the length of the current path in the low voltage side lead frame 108 and the length of the current path 110 in the AC lead frame 107 is approximately the same for all of the flyback diodes 104a through 104d. Due to this configuration, it is possible to make the inductance components L2a through L2d shown in FIG. 1 more uniform. Accordingly, it is possible to reduce the differences in the amounts of heat generated in the flyback diodes 104a through 104d, and thus it is possible to make their electrical characteristics more uniform.

According to the fourth embodiment of the present invention as explained above, in a similar manner to the case with the first embodiment, when the flyback diodes 103a through 103d are connected in parallel and also the flyback diodes 104a through 104d are connected in parallel, it is possible to make the inductance components L1a through L1d uniform and also to make the inductance components L2a through L2d uniform, so that it is possible to make the electrical characteristics of the flyback diodes 103a through 103d more uniform, and to make the electrical characteristics of the flyback diodes 104a through 104d more uniform.

Embodiment #5

Figure 11:
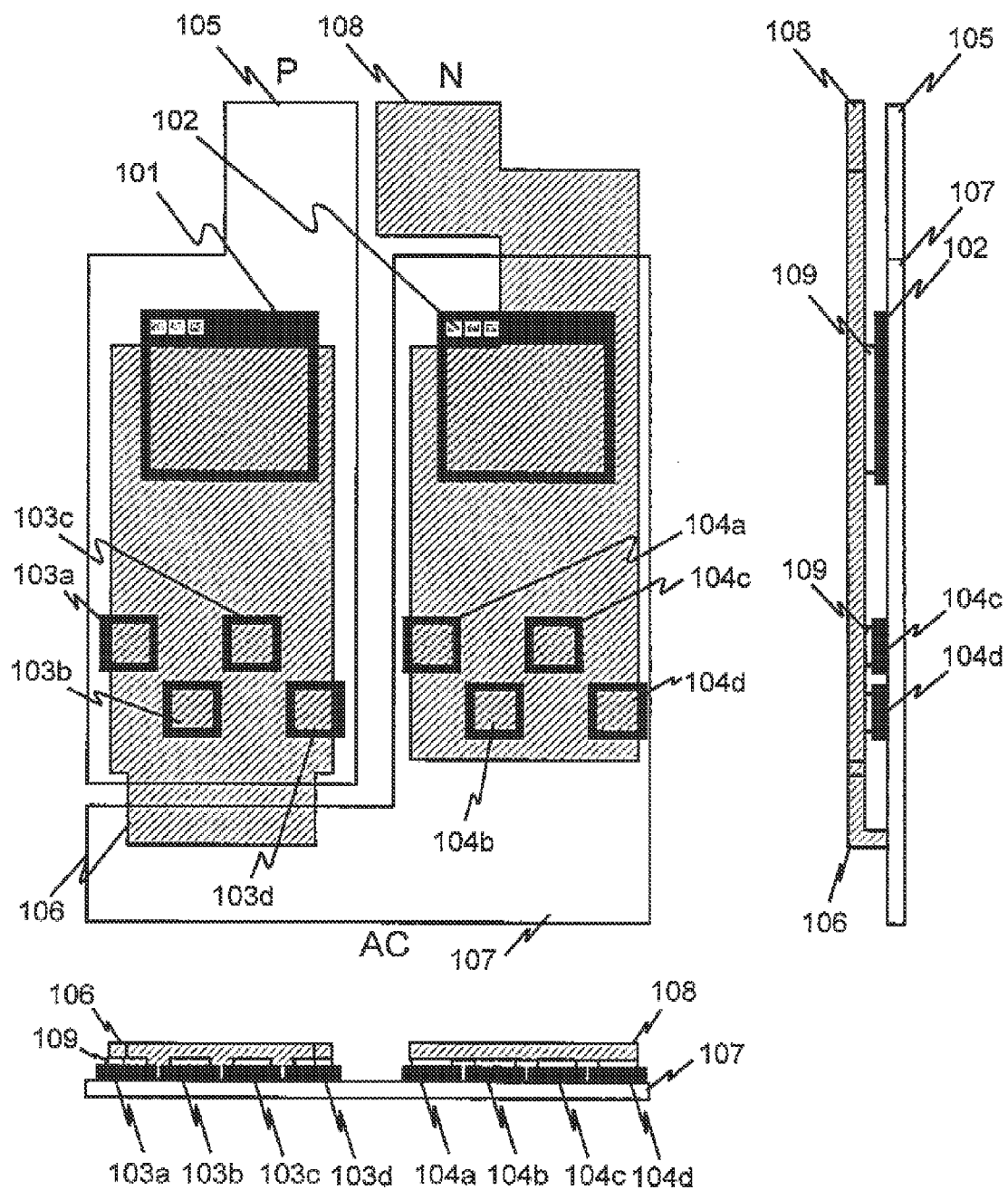
FIG. 11 is a three-view drawing showing a mounting arrangement in an inverter device according to a fifth embodiment of the present invention.

FIG. 11 is a three-view drawing showing a mounting arrangement in the inverter device 100 according to a fifth embodiment of the present invention. In this embodiment, the flyback diodes 103a through 103d of the upper arm portion and the flyback diodes 104a through 104d of the lower arm portion are all arranged in the positional relationships shown in FIG. 11. It should be understood that the shapes of the connecting lead frame 106 and the AC lead frame 107 are the same as those in the fourth embodiment shown in FIG. 9.

In this embodiment, in a similar manner to the case with the first embodiment described above, as shown in FIG. 11, among the flyback diodes 103a through 103d and 104a through 104d, those pairs of them that are arranged in mutually adjacent positions are arranged to confront one another via mutually opposing vertices. Furthermore, among the flyback diodes 103a through 103d, the flyback diode 103a and the flyback diode 103b are mutually adjacent, as are the flyback diode 103b and the flyback diode 103c, and the flyback diode 103c and the flyback diode 103d. In other words, among the four flyback diodes 103a through 103d, the total number of pairs whose vertices mutually oppose one another is three. In a similar manner, among the four flyback diodes 104a through 104d, the total number of pairs whose vertices mutually oppose one another is three. In this manner, the flyback diodes 103a through 103d are arranged so that the total number of pairs whose vertices mutually oppose one another is one less than the total number of flyback diodes 103a through 103d; and the same holds for the flyback diodes 104a through 104d. Due to this, it is possible to alleviate thermal interference between the flyback diodes 103a through 103d and 104a through 104d, so that it is possible to perform sufficient heat dissipation from them.

Moreover, in a similar manner to the case with the fourth embodiment described above, the lengths of the flyback current paths for the flyback diodes 103a through 103d and for the flyback diodes 104a through 104d are approximately the same. Accordingly, when the flyback diodes 103a through 103d are connected in parallel and also the flyback diodes 104a through 104d are connected in parallel, it is possible to make the inductance components L1a through L1d uniform and also to make the inductance components L2a through L2d uniform, so that it is possible to make the electrical characteristics of the flyback diodes 103a through 103d more uniform, and to make the electrical characteristics of the flyback diodes 104a through 104d more uniform.

Embodiment #6

Figure 12:
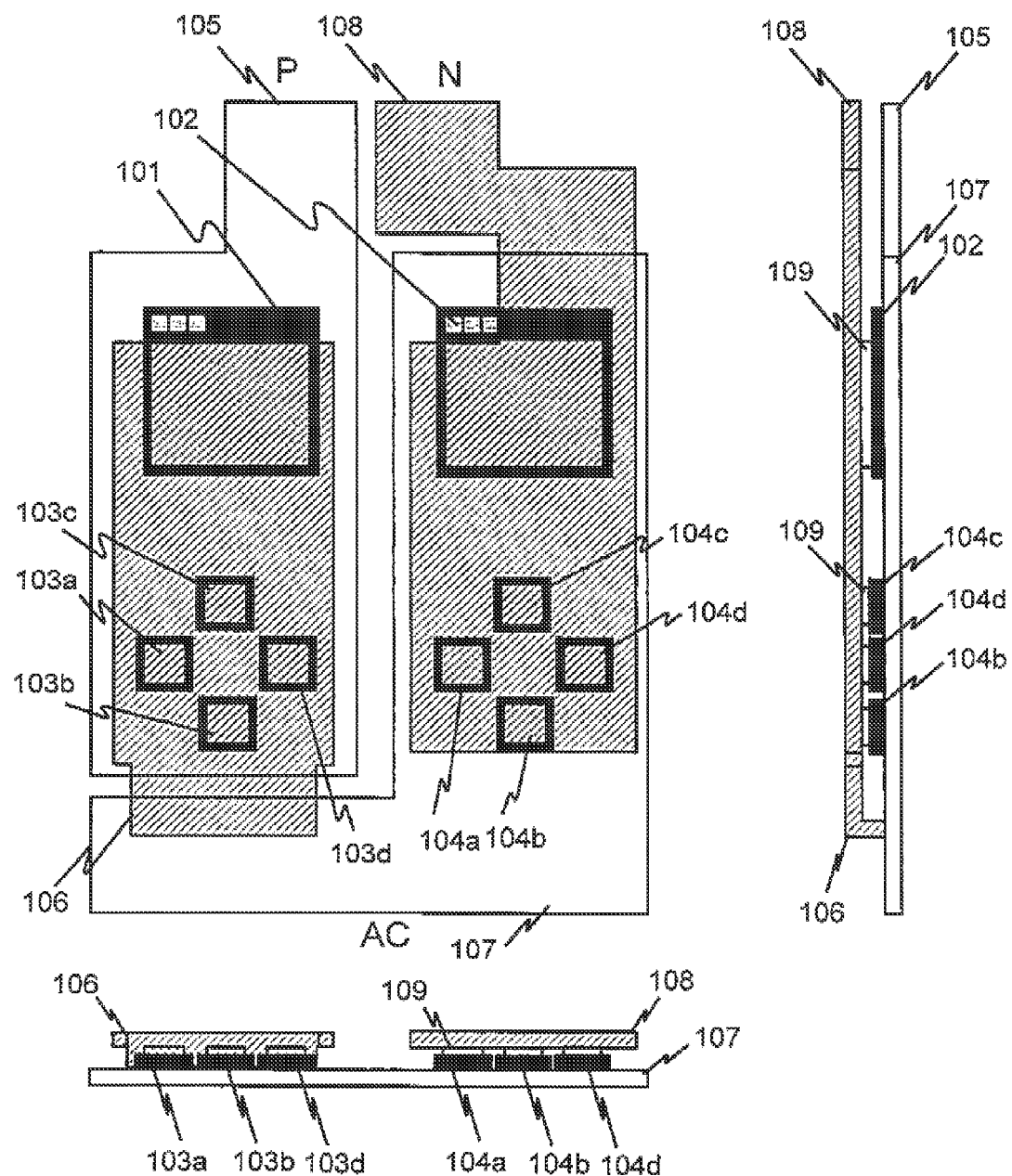
FIG. 12 is a three-view drawing showing a mounting arrangement in an inverter device according to a sixth embodiment of the present invention.

FIG. 12 is a three-view drawing showing a mounting arrangement of the inverter device 100 according to a sixth embodiment of the present invention. In this embodiment, the flyback diodes 103a through 103d of the upper arm portion and the flyback diodes 104a through 104d of the lower arm portion are all arranged in the positional relationships shown in FIG. 12. It should be understood that the shapes of the connecting lead frame 106 and the AC lead frame 107 are the same as those in the fourth and fifth embodiments shown in FIGS. 9 and 11 respectively.

In this embodiment, in a similar manner to the case with the fifth embodiment described above, among the flyback diodes 103a through 103d and 104a through 104d, those pairs of them that are arranged in mutually adjacent positions are arranged so as to confront one another via mutually opposing vertices. Due to this, it is possible to alleviate mutual thermal interference between the flyback diodes 103a through 103d and 104a through 104d, so that it is possible to perform sufficient heat dissipation from them.

Moreover, in a similar manner to the case with the fourth and fifth embodiments described above, the lengths of the flyback current paths for the flyback diodes 103a through 103d and for the flyback diodes 104a through 104d are approximately the same. Accordingly, when the flyback diodes 103a through 103d are connected in parallel and also the flyback diodes 104a through 104d are connected in parallel, it is possible to make the inductance components L1a through L1d uniform and also to make the inductance components L2a through L2d uniform, so that it is possible to make the electrical characteristics of the flyback diodes 103a through 103d more uniform, and to make the electrical characteristics of the flyback diodes 104a through 104d more uniform.

Embodiment #7

Figure 13:
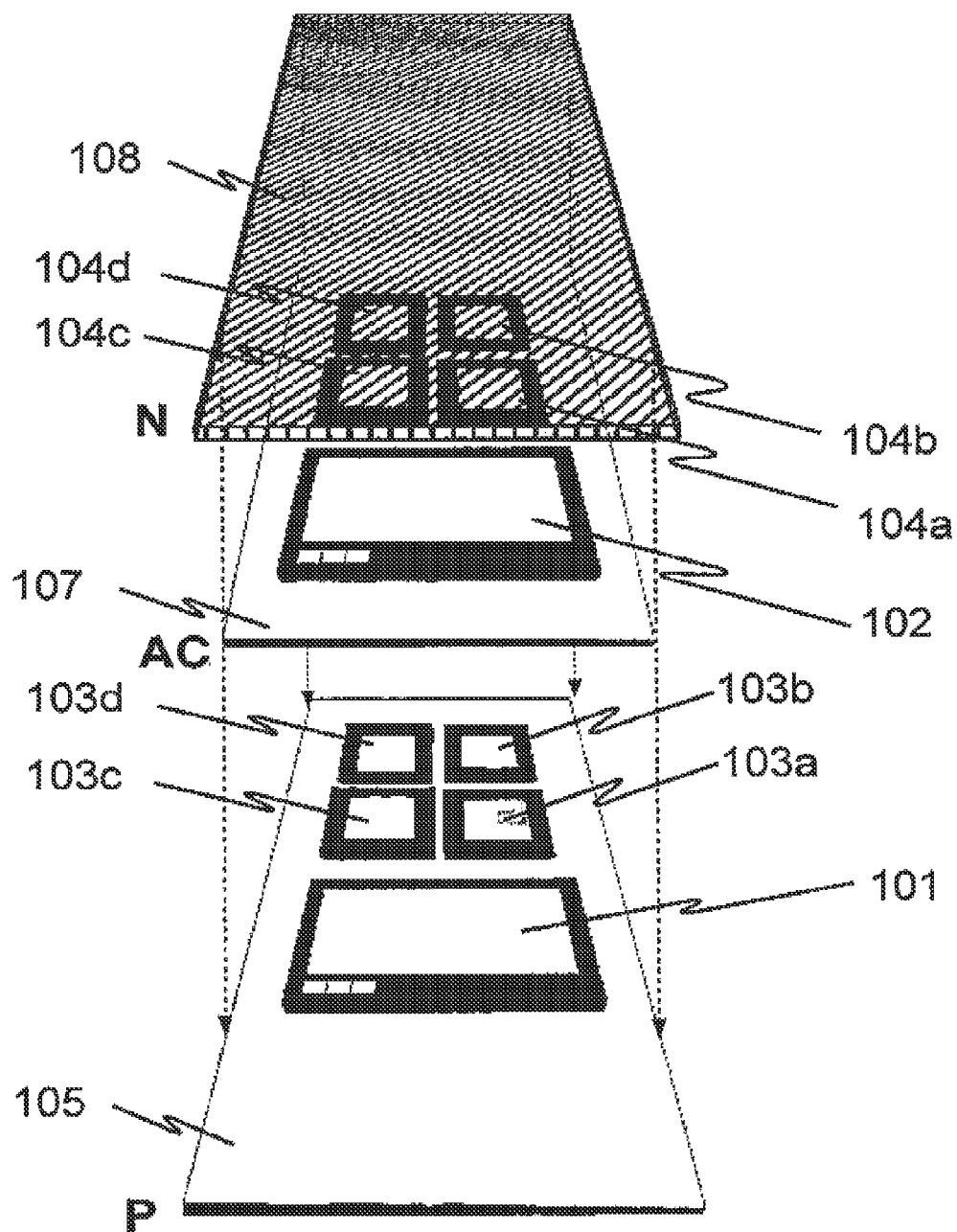
FIG. 13 is an exploded perspective view showing a mounting arrangement in an inverter device according to a seventh embodiment of the present invention.

FIG. 13 is an exploded perspective view showing a mounting arrangement of the inverter device 100 according to a seventh embodiment of the present invention. In this embodiment, as shown in FIG. 13, the switching element 102 and the flyback diodes 104a through 104d of the lower arm portion are laid over the switching element 101 and the flyback diodes 103a through 103d of the upper arm portion, with the AC lead frame 107 being sandwiched between them. The high voltage side lead frame 105 is disposed below the switching element 101 and the flyback diodes 103a through 103d of the upper arm portion, and the low voltage side lead frame 108 is disposed above the switching element 102 and the flyback diodes 104a through 104d of the lower arm portion.

Figure 14A:
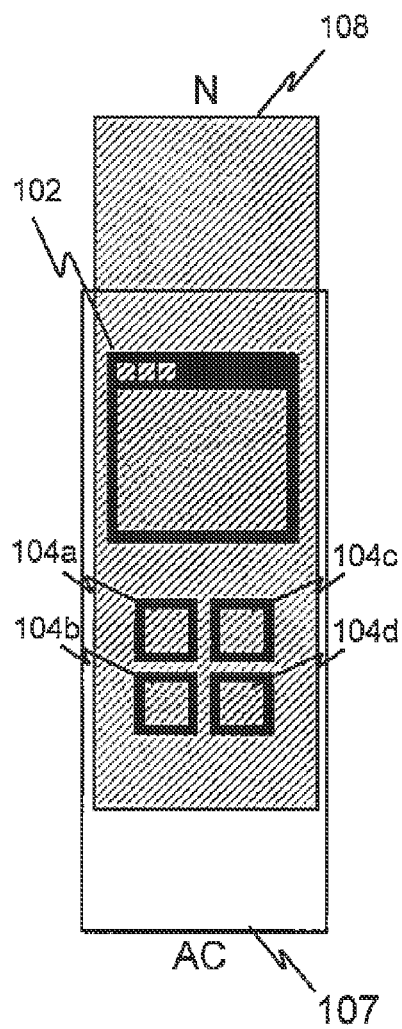
FIGS. 14A, 14B, and 14C are figures showing the mounting arrangement in this inverter device according to the seventh embodiment of the present invention.
Figure 14B:
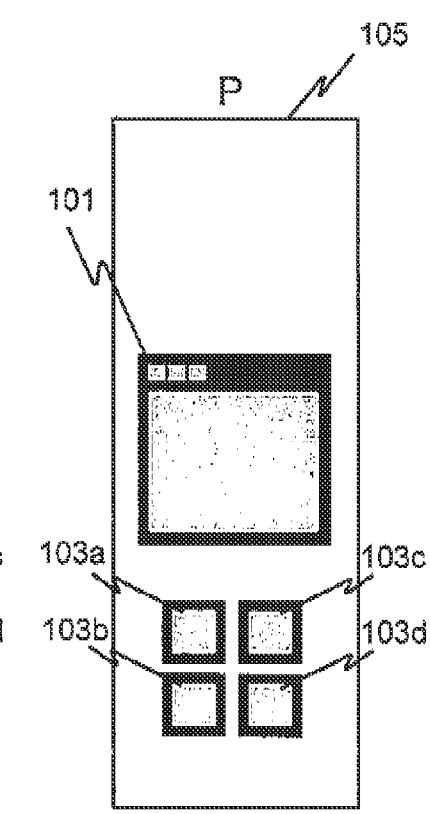
Figure 14C:
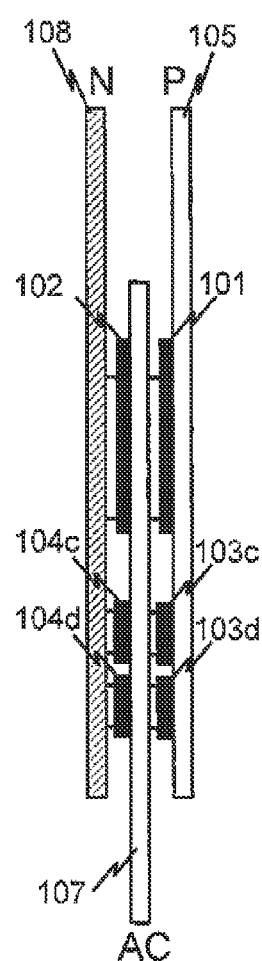

FIGS. 14A, 14B, and 14C are figures showing this mounting arrangement of the inverter device according to the seventh embodiment of the present invention. FIG. 14A shows a plan view of the lower arm assembly, in which the switching element 102 and the flyback diodes 104a through 104d of the lower arm portion are disposed between the AC lead frame 107 and the low voltage side lead frame 108. And FIG. 14B shows a plan view of the upper arm assembly, in which the switching element 101 and the flyback diodes 103a through 103d of the upper arm portion are disposed upon the high voltage side lead frame 105. Moreover, FIG. 14C is a side view showing this upper arm assembly and this lower arm assembly combined together.

By arranging the lower arm assembly of FIG. 14A as superimposed above the upper arm assembly of FIG. 14B, these two assemblies are combined together as shown in FIG.

14C. Due to this, it is possible to assemble the inverter device 100 having the construction shown in FIG. 13.

FIG. 15 is a figure showing an example of the flyback current paths in the lower arm portion of this seventh embodiment of the present invention. It should be understood that, in FIG. 15, in order to make the flyback current paths easier to understand, the switching element 102 is omitted from the figure.

In this embodiment, the flyback currents that flow via the flyback diodes 104a through 104d of the lower arm portion each pursue a current path as shown in FIG. 15 in the low voltage side lead frame 108 and the AC lead frame 107. The lengths of the current paths 110 in the low voltage side lead frame 108 shown by the solid lines are approximately equal to their lengths upon the low voltage side lead frame 108 from the N terminal that is connected to the negative electrode side of the DC power supply 400, in other words from its upper edge portion, to the anode terminals of the flyback diodes 104a through 104d respectively. Moreover, the lengths of the current paths in the AC lead frame 107 are approximately equal to the lengths upon the AC lead frame 107 from the cathode terminals of the flyback diodes 104a through 104d to the AC terminal that is connected to the load 300 side, in other words to its lower edge portion, respectively. The sums of these lengths are of the same general order for all of the flyback diodes 104a through 104d, Thus, in this manner, in this embodiment as well, the flyback diodes 104a through 104d are arranged so that the sum of the length of the current path in the low voltage side lead frame 108 and the length of the current path in the AC lead frame 107 is approximately the same for each of the flyback diodes 104a through 104d. Due to this, it is possible to make the inductance components L2a through L2d shown in FIG. 1 uniform. Accordingly it is possible to reduce differences in the amounts of heat generated in the flyback diodes 104a through 104d, and thus it is possible to keep their electrical characteristics more uniform.

It should be understood that while, in FIG. 15, an example is shown of the flyback current paths for the lower arm portion, the same holds for the flyback current paths in the upper arm portion as well. In other words the flyback diodes 103a through 103d are arranged so that, for each of the flyback diodes 103a through 103d, the sum of the length of its current path in the AC lead frame 107 and the length of its current path in the high voltage side lead frame 105 is approximately the same. Due to this, it is possible to make the inductance components L1a through L1d shown in FIG. 1 uniform. Accordingly it is possible to reduce differences in the amounts of heat generated in the flyback diodes 103a through 103d, and thus it is possible to keep their electrical characteristics more uniform.

Embodiment #8

Figure 16A:
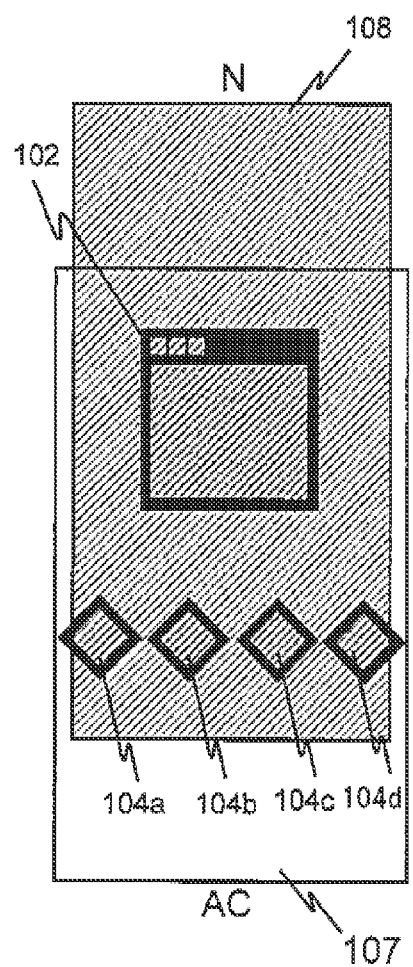
FIGS. 16A, 16B, and 16C are figures showing a mounting arrangement in an inverter device according to an eighth embodiment of the present invention.
Figure 16B:
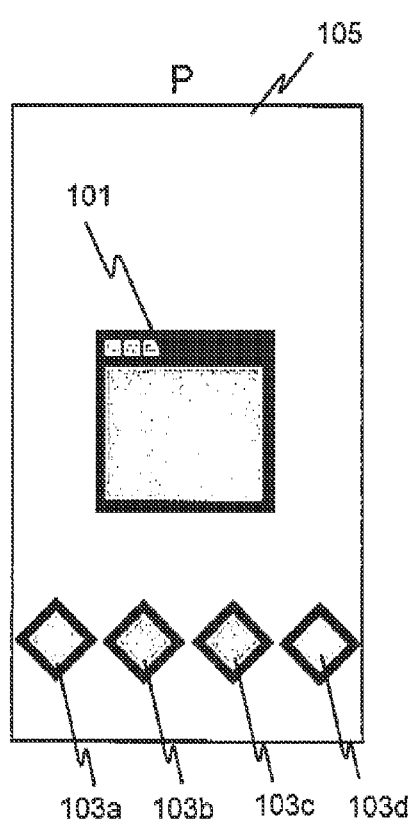
Figure 16C:
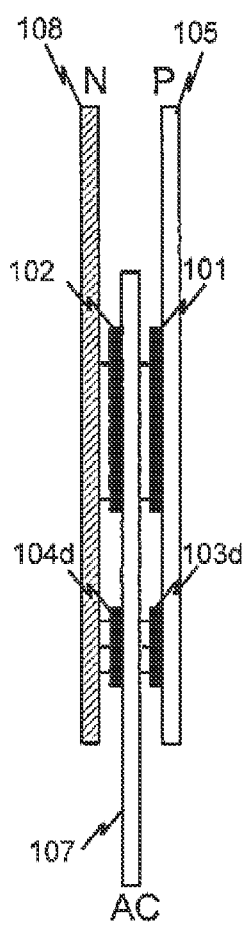

FIGS. 16A, 16B, and 16C are figures showing a mounting arrangement in the inverter device according to an eighth embodiment of the present invention. In this embodiment, the flyback diodes 103a through 103d of the upper arm portion and the flyback diodes 104a through 104d of the lower arm portion are all arranged in the positional relationships shown in FIGS. 16A, 16B and 16C. It should be understood that FIG. 16A shows a plan view of a lower arm assembly, in which the switching element 102 and the flyback diodes 104a through 104d of the lower arm portion are disposed between the AC lead frame 107 and the low voltage side lead frame 108. And FIG. 16B shows a plan view of an upper arm assembly in which the switching element 101 and the flyback diodes 103a through 103d of the upper arm portion are disposed upon the high voltage side lead frame 105. Moreover, FIG. 16C is a side view showing this upper arm assembly and this lower arm assembly combined together.

In this embodiment, in a similar manner to the cases with the embodiments including the first embodiment described above, among the flyback diodes 103a through 103d and 104a through 104d, those pairs of them that are arranged in mutually adjacent positions are arranged to confront one another via mutually opposing vertices. Due to this, it is possible to alleviate mutual thermal interference between the flyback diodes 103a through 103d and 104a through 104d, so that it is possible to perform sufficient heat dissipation from them.

Moreover, in a similar manner to the case with the seventh embodiment described above, the lengths of the flyback current paths for the flyback diodes 103a through 103d and for the flyback diodes 104a through 104d are approximately the same. Accordingly, when the flyback diodes 103a through 103d are connected in parallel and also the flyback diodes 104a through 104d are connected in parallel, it is possible to make the inductance components L1a through L1d uniform and also to make the inductance components L2a through L2d uniform, so that it is possible to make the electrical characteristics of the flyback diodes 103a through 103d more uniform, and to make the electrical characteristics of the flyback diodes 104a through 104d more uniform.

Embodiment #9

Figure 17A:
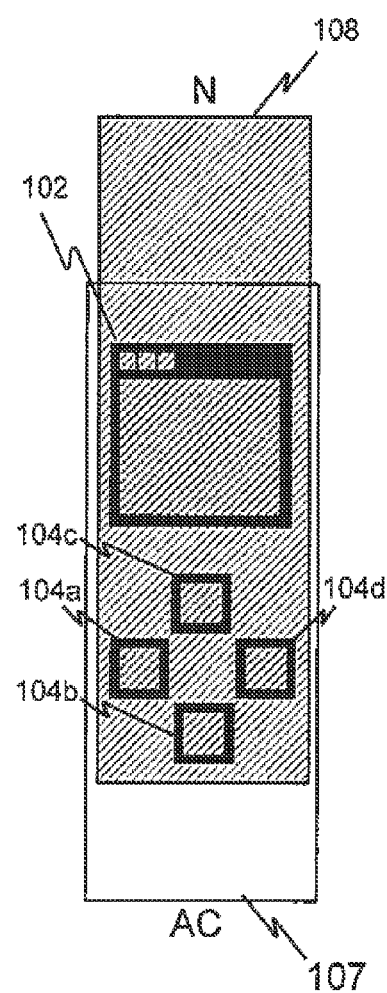
FIGS. 17A, 17B, and 17C are figures showing a mounting arrangement in an inverter device according to a ninth embodiment of the present invention.
Figure 17B:
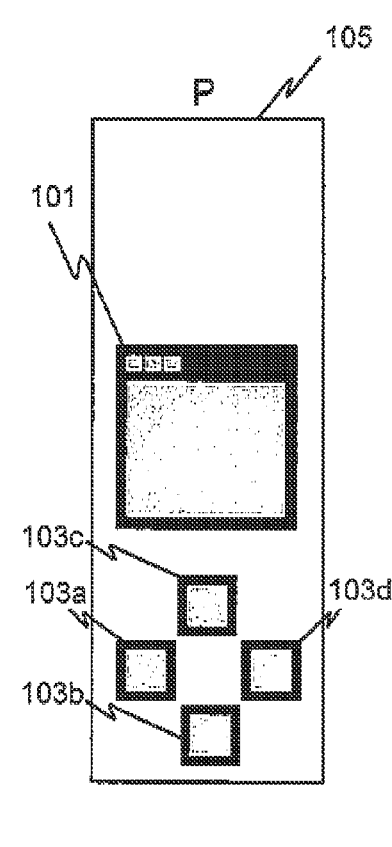
Figure 17C:
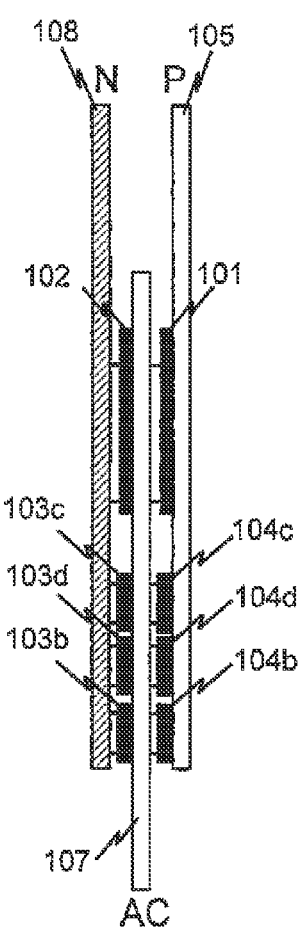

FIGS. 17A, 17B, and 17C are figures showing a mounting arrangement in the inverter device 100 according to a ninth embodiment of the present invention. In this embodiment, the flyback diodes 103a through 103d of the upper arm portion and the flyback diodes 104a through 104d of the lower arm portion are all arranged in the positional relationships shown in FIGS. 17A, 17B and 17C. It should be understood that FIG. 17A shows a plan view of a lower arm assembly, in which the switching element 102 and the flyback diodes 104a through 104d of the lower arm portion are disposed between the AC lead frame 107 and the low voltage side lead frame 108. And FIG. 17B shows a plan view of an upper arm assembly in which the switching element 101 and the flyback diodes 103a through 103d of the upper arm portion are disposed upon the high voltage side lead frame 105. Moreover, FIG. 17C is a side view showing this upper arm assembly and this lower arm assembly combined together.

In this embodiment, in a similar manner to the cases with the embodiment including the first embodiment described above, among the flyback diodes 103a through 103d and 104a through 104d, those pairs of them that are arranged in mutually adjacent positions are arranged so that they confront one another via mutually opposing vertices. Due to this, it is possible to alleviate mutual thermal interference between the flyback diodes 103a through 103d and 104a through 104d, so that it is possible to perform sufficient heat dissipation from them.

Moreover, in a similar manner to the case with the seventh embodiment described above, the lengths of the flyback current paths for the flyback diodes 103a through 103d and for the flyback diodes 104a through 104d are approximately the same. Accordingly, when the flyback diodes 103a through 103d are connected in parallel and also the flyback diodes 104a through 104d are connected in parallel, it is possible to make the inductance components L1a through L1d uniform and also to make the inductance components L2a through L2d uniform, so that it is possible to make the electrical characteristics of the flyback diodes 103a through 103d more uniform, and to make the electrical characteristics of the flyback diodes 104a through 104d more uniform.

Embodiment #10

Figure 18A:
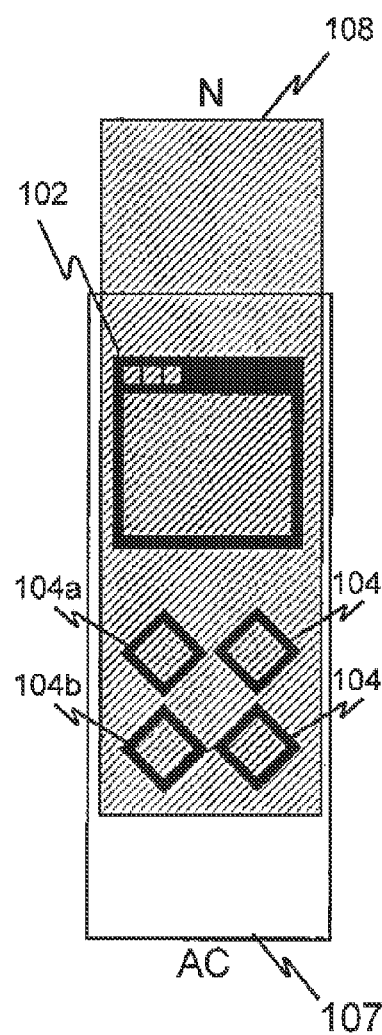
FIGS. 18A, 18B, and 18C are figures showing a mounting arrangement in an inverter device according to a tenth embodiment of the present invention.
Figure 18B:
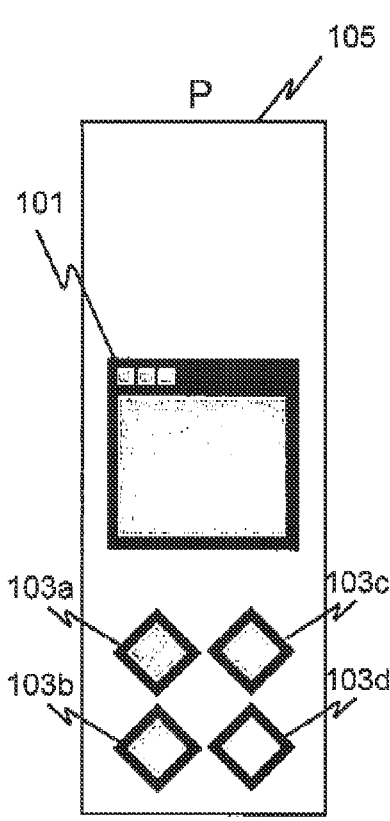
Figure 18C:
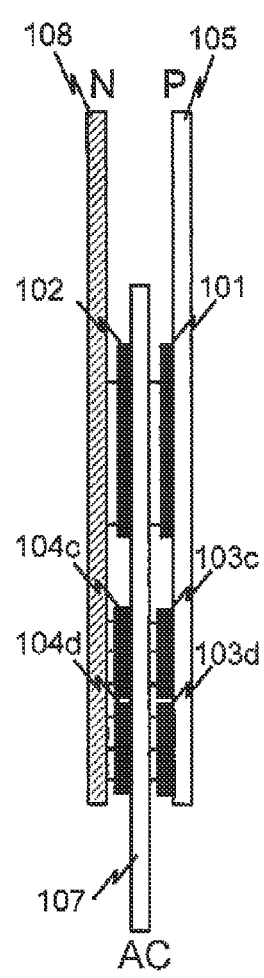

FIGS. 18A, 18B, and 18C are figures showing a mounting arrangement in the inverter device 100 according to a tenth embodiment of the present invention. In this embodiment, the flyback diodes 103a through 103d of the upper arm portion and the flyback diodes 104a through 104d of the lower arm portion are all arranged in the positional relationships shown in FIGS. 18A, 18B and 18C. It should be understood that FIG. 18A shows a plan view of a lower arm assembly, in which the switching element 102 and the flyback diodes 104a through 104d of the lower arm portion are disposed between the AC lead frame 107 and the low voltage side lead frame 108. And FIG. 18B shows a plan view of an upper arm assembly in which the switching element 101 and the flyback diodes 103a through 103d of the upper arm portion are disposed upon the high voltage side lead frame 105. Moreover, FIG. 18C is a side view showing this upper arm assembly and this lower arm assembly combined together.

In this embodiment, in a similar manner to the cases with the embodiments including the first embodiment described above, among the flyback diodes 103a through 103d and 104a through 104d, those pairs of them that are arranged in mutually adjacent positions are arranged so that they confront one another via mutually opposing vertices. Due to this, it is possible to alleviate mutual thermal interference between the flyback diodes 103a through 103d and 104a through 104d, so that it is possible to perform sufficient heat dissipation from them.

Moreover, in a similar manner to the case with the seventh embodiment described above, the lengths of the flyback current paths for the flyback diodes 103a through 103d and for the flyback diodes 104a through 104d are approximately the same. Accordingly, when the flyback diodes 103a through 103d are connected in parallel and also the flyback diodes 104a through 104d are connected in parallel, it is possible to make the inductance components L1a through L1d uniform and also to make the inductance components L2a through L2d uniform, so that it is possible to make the electrical characteristics of the flyback diodes 103a through 103d more uniform, and to make the electrical characteristics of the flyback diodes 104a through 104d more uniform.

It should be understood that, in the first through the tenth embodiments explained above, cases were explained in which the switching elements 101 and 102 (or 101a through 101d and 102a through 102d) and the flyback diodes 103a through 103d and 104a through 104d were all shaped as quadrilaterals. However, it would also be acceptable to arrange for them to have other shapes. In fact, it would be possible for the switching elements 101 and 102 (or 101a through 101d and 102a through 102d) and the flyback diodes 103a through 103d and 104a through 104d to have any shapes, provided that they are shaped as polygons.

The various embodiments and variant embodiments described above have only been cited as examples, and the present invention should not be considered as being limited by any of the details thereof, provided that the essential characteristics present invention are preserved.

What is claimed is:

1. An inverter device, comprising:
    a switching element having a front side surface and a back side surface;
    a plurality of flyback diodes each connected in parallel with the switching element;
    a first conductor plate connected to anode terminals of the flyback diodes and to the front side surface of the switching element; and
    a second conductor plate connected to cathode terminals of the flyback diodes and to the back side surface of the switching element; wherein:
    the switching element and the plurality of flyback diodes are sandwiched between the first conductor plate and the second conductor plate;
    each of the flyback diodes is formed in a polygonal shape;
    the plurality of the flyback diodes includes a first flyback diode and a second flyback diode which is arranged closest to the first flyback diode; and
    the first flyback diode and the second flyback diode are arranged so that a closest part of the first flyback diode to the second flyback diode is a first vertex of the first flyback diode and a closet part of the second flyback diode to the first flyback diode is a second vertex of the second flyback diode.

2. The inverter device according to claim 1, wherein the flyback diodes are arranged so that, for each of at least two or more of the flyback diodes, a sum of a length of a current path in the first conductor plate and a length of a current path in the second conductor plate are approximately same.

3. The inverter device according to claim 2, wherein:
    the first conductor plate has a first edge portion connected to a load side or to a negative electrode side of a power supply;
    the second conductor plate has a second edge portion connected to a positive electrode side of the power supply or to the load side; and
    the flyback diodes are arranged so that, for each of at least two or more of the flyback diodes, a sum of a length upon the first conductor plate from the first edge portion to the anode terminal of the flyback diode and a length upon the second conductor plate from the cathode terminal of the flyback diode to the second edge portion are approximately same.

4. The inverter device according to claim 1, wherein the flyback diodes are arranged so that a total number of pairs of mutually opposing vertices thereof is one less than a total number of the flyback diodes.

5. The inverter device according to claim 1, wherein:
    a plurality of the switching elements are provided, each having a polygonal shape;
    the plurality of switching elements includes a first switching element and a second switching element which is arranged closest to the first switching element and
    the first switching element and the second switching element are arranged so that a closest part of the first switching element to the second switching element is a third vertex of the first switching element and a closest part of the second switching element to the first switching element is a fourth vertex of the second switching element.

6. The inverter device according to claim 5, wherein the switching elements are arranged so that, for each of at least two or more of the switching elements, a sum of a length of a current path in the first conductor plate and a length of a current path in the second conductor plate are approximately same.

7. The inverter device according to claim 6, wherein:
    the first conductor plate has a first edge portion connected to a load side or to a negative electrode side of a power supply;
    the second conductor plate has a second edge portion connected to a positive electrode side of the power supply or to the load side; and
    the switching elements are arranged so that, for each of at least two or more of the switching elements, a sum of a length upon the second conductor plate from the second edge portion to the switching element and a length upon the first conductor plate from the switching element to the first edge portion are approximately same.

8. The inverter device according to claim 5, wherein the switching elements are arranged so that a total number of pairs of mutually opposing vertices thereof is one less than a total number of the switching elements.

* * * * *